(12) United States Patent
Naito et al.

(10) Patent No.: US 11,888,098 B2
(45) Date of Patent: Jan. 30, 2024

(54) COMPOSITION, FILM, LAMINATED STRUCTURE, LIGHT-EMITTING DEVICE, AND DISPLAY

(71) Applicant: Sumitomo Chemical Company, Limited, Tokyo (JP)

(72) Inventors: Shota Naito, Tsukuba (JP); Kentaro Mase, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 622 days.

(21) Appl. No.: 16/632,942

(22) PCT Filed: Jul. 26, 2018

(86) PCT No.: PCT/JP2018/028064
§ 371 (c)(1),
(2) Date: Jan. 22, 2020

(87) PCT Pub. No.: WO2019/022194
PCT Pub. Date: Jan. 31, 2019

(65) Prior Publication Data
US 2020/0243732 A1    Jul. 30, 2020

(30) Foreign Application Priority Data
Jul. 28, 2017    (JP) .................................. 2017-146318

(51) Int. Cl.
*C09K 11/02*    (2006.01)
*C09K 3/14*    (2006.01)
*C09K 11/66*    (2006.01)
*H01L 33/50*    (2010.01)
(Continued)

(52) U.S. Cl.
CPC .............. *H01L 33/56* (2013.01); *C09K 11/02* (2013.01); *C09K 11/66* (2013.01); *C09K 11/665* (2013.01);
(Continued)

(58) Field of Classification Search
CPC ....... C09K 11/02; C09K 11/66; C09K 11/665; C09K 3/1436; H01L 33/28; H01L 33/502;
(Continued)

(56) References Cited

U.S. PATENT DOCUMENTS 3,492,102 A * 1/1970 Friedrich .................. B22F 7/04
428/641
11,268,023 B2 * 3/2022 Naito .................. C09K 11/0883
(Continued)

FOREIGN PATENT DOCUMENTS

CN    106847955 A    6/2017
EP    3184602 A1    6/2017
(Continued)

OTHER PUBLICATIONS

Suttiponparnit et al., "Role of Surface Area, Primary Particle Size and Crystal Phase on Titanium Dioxide Nanoparticle Dispersion Properties", Nanoscale Research Letters, 6:27, pp. 1-8 (Year: 2011).*
(Continued)

*Primary Examiner* — Matthew E. Hoban
*Assistant Examiner* — Lynne Edmondson
(74) *Attorney, Agent, or Firm* — Morgan, Lewis & Bockius LLP

(57) ABSTRACT

The present disclosure relates to a light-emitting composition containing a perovskite compound and inorganic fine particles.

20 Claims, 1 Drawing Sheet

(51) Int. Cl.
- *H01L 33/56* (2010.01)
- *G02F 1/13357* (2006.01)
- *H01L 25/075* (2006.01)
- *H01L 33/28* (2010.01)

(52) U.S. Cl.
CPC .... *G02F 1/133603* (2013.01); *H01L 25/0753* (2013.01); *H01L 33/28* (2013.01)

(58) Field of Classification Search
CPC ............... H01L 33/56; H01L 21/02197; H01L 25/0753; H01L 28/55; H01L 41/0805; G02F 1/133603; H01J 2237/3341; B32B 2264/12; C01P 2006/12

See application file for complete search history.

(56) References Cited

U.S. PATENT DOCUMENTS

| | | | |
|---|---|---|---|
| 11,306,243 B2* | 4/2022 | Naito | C09K 11/665 |
| 2012/0018761 A1 | 1/2012 | Honda | |
| 2016/0141535 A1* | 5/2016 | Snaith | H01L 51/424 |
| | | | 438/82 |
| 2019/0018287 A1* | 1/2019 | Lüchinger | H01L 27/322 |
| 2021/0262171 A1† | 8/2021 | McIntyre | |

FOREIGN PATENT DOCUMENTS

| | | |
|---|---|---|
| JP | 2008-134585 A | 6/2008 |
| JP | 2012-078538 A | 4/2012 |
| JP | 2019-502954 A | 1/2019 |
| JP | 2021-527746 A | 10/2021 |
| WO | 2010/110204 A1 | 9/2010 |
| WO | 2016/050517 A1 | 4/2016 |
| WO | 2017/102360 A1 | 6/2017 |
| WO | 2017/108962 A1 † | 6/2017 |

OTHER PUBLICATIONS

Office Action issued in related Japanese Patent Application No. 2019-532859 dated Feb. 1, 2022.

Longo et al., "Highly luminescent perovskite-aluminum oxide composites," Journal of Materials Chemistry C, 3 (43): 11286-11289 (2015).

Extended European Search Report issued in related European Patent Application No. 18837327.8 dated Mar. 5, 2021.

International Search Report issued in corresponding International Patent Application No. PCT/JP2018/028064 dated Oct. 30, 2018.

Protesescu et al., "Nanocrystals of Cesium Lead Halide Perovskites ($CsPbX_3$, X=Cl, Br, and I): Novel Optoelectronic Materials Showing Bright Emission with Wide Color Gamut," Nano Letters, 15: 3692-3696 (2015).

Office Action issued in corresponding Chinese Patent Application No. 201880049494.9 dated May 28, 2021.

"Nanoplast Technology", Duo Yingxian, Zhang Yulong, pp. 42-44, Zhejiang Science and Technology Publishing House, Dec. 1, 2006 (see English translation of CN OA).

Office Action issued in related Chinese Patent Application No. 201880049494.9 dated Nov. 23, 2021.

Office Action issued in related European Patent Application No. 18837327.8 dated Dec. 8, 2021.

Office Action issued in related Japanese Patent Application No. 2019-532859 dated Aug. 23, 2022.

Office Action issued in related Taiwanese Patent Application No. 107126165 dated Apr. 11, 2022.

Third Party Observations filed in related Japanese Patent Application No. 2019-532859 dated Apr. 26, 2022.

Office Action issued in related Korean Patent Application No. 10-2020-7001741 dated Apr. 10, 2023.

Protesescu et al., "Nanocrystals of Cesium Lead Halide Perovskites ($CsPbX_3$, X=Cl, Br, and I): Novel Optoelectronic Materials Showing Bright Emission with Wide Color Gamut", Nano Lett. 2015, 15, 3692-3696 and Supporting Information.†

KRONOS 2800 Titanium Dioxide datasheet, 1 page, Kronos International, Inc., 2014.†

\* cited by examiner
† cited by third party

COMPOSITION, FILM, LAMINATED STRUCTURE, LIGHT-EMITTING DEVICE, AND DISPLAY

TECHNICAL FIELD

The present invention relates to a composition, a film, a laminated structure, a light-emitting device, and a display.

Priority is claimed on Japanese Patent Application No. 2017-146318, filed on Jul. 28, 2017, the content of which is incorporated herein by reference.

BACKGROUND ART

An LED backlight which includes a blue LED and a light-emitting composition has been developed. In recent years, there is a growing interest in a perovskite compound as a light-emitting compound contained in the composition (Non-Patent Literature 1).

CITATION LIST

Non-Patent Literature

[NPL 1] L. Protesescu, S. Yakunin, M. I. Bodnarchuk, F. Krieg, R. Caputo, C. H. Hendon, R. X. Yang, A. Walsh, and M. V. Kovalenko, Nano Letters, 15, p. 3692 to 3696 (2015)

DISCLOSURE OF INVENTION

Technical Problem

However, the composition containing a perovskite compound as described in Non-Patent Literature 1 is required to further improve the quantum yield at the time of application in the industrial field as a light-emitting material.

The present invention has been made in consideration of the above-described problem, and an object thereof is to provide a composition which contains a perovskite compound and has a high quantum yield, and a film, a laminated structure, a light-emitting device, and a display obtained by using the composition.

Solution to Problem

As the result of intensive research conducted by the present inventors in order to achieve the above-described object, it was found that a composition which contains a perovskite compound and an inorganic fine particles having a specific surface area of 0.01 $m^2/g$ to 150 $m^2/g$ has a high quantum yield.

In other words, embodiments of the present invention include the inventions of [1] to [22] described below.

- [1] A composition having a light-emitting property including: a component (1) which is a perovskite compound including constituent components A, B, and X; and a component (2) which is inorganic fine particles having a specific surface area of 0.01 $m^2/g$ to 150 $m^2/g$.

(the constituent component A indicates a component positioned at each vertex of a hexahedron having the constituent component B at the center in a perovskite type crystal structure and is a monovalent cation, the constituent component X indicates a component positioned at each vertex of an octahedron having the constituent component B at the center in the perovskite type crystal structure and is at least one anion selected from the group consisting of a halide ion and a thiocyanate ion, and the constituent component B indicates a component positioned at the centers of the hexahedron where the constituent component A is disposed at each vertex and the octahedron where the constituent component X is disposed at each vertex in the perovskite type crystal structure and is a metal ion)

- [2] The composition according to [1], in which the specific surface area of the inorganic fine particles is in a range of 0.1 $m^2/g$ to 70 $m^2/g$.
- [3] The composition according to [2], in which the specific surface area of the inorganic fine particles is in a range of 0.4 $m^2/g$ to 10 $m^2/g$.
- [4] The composition according to any one of [1] to [3], in which an average particle diameter of the inorganic fine particles is in a range of 100 nm to 100 μm.
- [5] The composition according to [4], in which the average particle diameter of the inorganic fine particles is in a range of 150 nm to 30 μm.
- [6] The composition according to [5], in which the average particle diameter of the inorganic fine particles is in a range of 170 nm to 5 μm.
- [7] The composition according to any one of [1] to [6], in which the component (2) is inorganic fine particles of an oxide.
- [8] The composition according to any one of [1] to [7], in which the component (2) is crystalline inorganic fine particles.
- [9] The composition according to [8], in which the oxide is at least one selected from the group consisting of aluminum oxide, zinc oxide, and niobium oxide.
- [10] The composition according to [8], in which the oxide is at least one selected from the group consisting of aluminum oxide and niobium oxide.
- [11] The composition according to [8], in which the oxide is niobium oxide.
- [12] The composition according to any one of [1] to [11], in which the component (1) is a perovskite compound having a three-dimensional structure.
- [13] The composition according to any one of [1] to [12], in which the component (1) is a perovskite compound having cesium ions as the constituent component A.
- [14] The composition according to any one of [1] to [13], further including: at least one selected from the group consisting of a component (3) and a component (4), in which the component (3) is a solvent, and the component (4) is a polymerizable compound or a polymer thereof.
- [15] The composition according to any one of [1] to [13], further including: a component (4'), in which a total content ratio of the component (1), the component (2), and the component (4') is 90% by mass or greater with respect to a total mass of the composition, and the component (4') is a polymer.
- [16] The composition according to any one of [1] to [15], further including: a component (5), in which the component (5) is at least one selected from the group consisting of ammonia, an amine, a carboxylic acid, and salts or ions thereof.
- [17] The composition according to any one of [1] to [16], further including: a component (6), in which the component (6) is a silazane or a modified product thereof.
- [18] The composition according to [17], in which the component (6) is a polysilazane or a modified product thereof.

[19] A film which is formed of the composition according to [15].

[20] A laminated structure including: the film according to [19].

[21] A light-emitting device including: the laminated structure according to [20].

[22] A display including: the laminated structure according to [20].

Advantageous Effects of Invention

According to the present invention, it is possible to provide a composition which contains a perovskite compound and has a high quantum yield, and a film, a laminated structure, a light-emitting device, and a display obtained by using the composition.

BEST MODE FOR CARRYING OUT THE INVENTION

<Composition>

Figure 1:
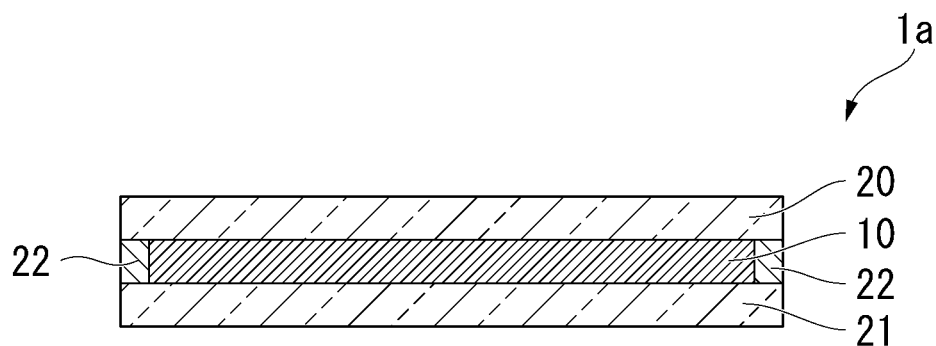
FIG. 1 is a cross-sectional view showing an embodiment of a laminated structure according to the present invention.

A composition according to the present embodiment has a light-emitting property. The "light-emitting property of the composition" indicates a property in which the composition emits light. It is preferable that the composition has a property in which light emission is made by absorption of excitation energy and more preferable that the composition has a property in which light emission is made by excitation with excitation light. The wavelength of excitation light may be, for example, in a range of 200 nm to 800 nm, in a range of 250 nm to 750 nm, or in a range of 300 nm to 700 nm.

The composition according to the present embodiment contains a component (1) and a component (2).

The component (1) is a perovskite compound including constituent components A, B, and X.

Hereinafter, the component will be referred to as the "component (1)".

The constituent component A indicates a component positioned at each vertex of a hexahedron having the constituent component B at the center in a perovskite type crystal structure and is a monovalent cation.

The constituent component X indicates a component positioned at each vertex of an octahedron having the constituent component B at the center in the perovskite type crystal structure and is at least one anion selected from the group consisting of a halide ion and a thiocyanate ion.

The constituent component B indicates a component positioned at the centers of the hexahedron where the constituent component A is disposed at each vertex and the octahedron where the constituent component X is disposed at each vertex in the perovskite type crystal structure and is a metal ion.

The component (2) is inorganic fine particles having a specific surface area of 0.01 $m^2/g$ to 150 $m^2/g$. Hereinafter, the component will be referred to as the "component (2)".

It is considered that in a case where the composition of the present embodiment contains the component (2), the perovskite compound efficiently absorbs light passing through the composition, the number of defect sites in the perovskite compound is reduced without deteriorating the perovskite compound, the probability of excited electrons trapping the defect sites is reduced, and thus the light absorption efficiency and the quantum yield are improved.

It is preferable that the composition according to the present embodiment contains at least one selected from the group consisting of a component (3) and a component (4) described below.

The component (3) is a solvent.

Hereinafter, the component will be referred to as the "component (3)".

The component (4) is a polymerizable compound or a polymer thereof. Hereinafter, the component will be referred to as the "component (4)".

In the present embodiment, it is preferable that the component (1) is dispersed in at least one selected from the group consisting of the component (3) and the component (4).

The composition according to the present embodiment may further include a component (5) described below.

The component (5) is at least one compound or ion selected from the group consisting of ammonia, an amine, a carboxylic acid, and salts or ions thereof.

Hereinafter, the component will be referred to as the "component (5)".

The composition according to the present embodiment may further include a component (6) described below.

The component (6) is a silazane or a modified product thereof.

In the present specification, the "modified product of the silazane" indicates a compound generated by performing a modification treatment on the silazane. A method for performing the modification treatment will be described below.

The composition according to the present embodiment may further include components other than the above-described components (1) to (6).

Examples of other components include a small amount of impurities and a compound having an amorphous structure formed of an element component constituting the perovskite compound, and a polymerization initiator.

The content ratio of other components is preferably 10% by mass or less, more preferably 5% by mass or less, still more preferably 1% by mass or less, and particularly preferably 0% by mass with respect to the total mass of the composition.

The composition according to the present embodiment may further include a component (4') described below, and the total content ratio of the component (1), the component (2), and the component (4') is preferably 90% by mass or greater with respect to the total mass of the composition.

The component (4') is a polymer.

In the composition according to the present embodiment, it is preferable that the component (1) is dispersed in the component (4').

In the composition according to the present embodiment, the total content ratio of the component (1), the component (2), and the component (4') may be 95% by mass or greater, 99% by mass or greater, or 100% by mass with respect to the total mass of the composition.

The composition according to the present embodiment may further include any one or both of the component (5) and the component (6). Examples of components other than the component (1), the component (2), the component (4'), the component (5), and the component (6) are the same as the components described as other components described above.

In the composition according to the embodiment which contains the component (1) and the component (2) as the essential components and at least one selected from the group consisting of the component (3) and the component (4), the content ratio of the component (1) to the total mass of the composition is not particularly limited as long as the effects of the present invention are exhibited. In the composition according to the present embodiment, from the viewpoint of making the perovskite compound difficult to aggregate and preventing the concentration quenching, it is preferable that the content ratio of the component (1) to the total mass of the composition is in the range described below.

Specifically, the content ratio thereof is preferably 50% by mass or less, more preferably 1% by mass or less, and still more preferably 0.5% by mass or less. Further, from the viewpoint of obtaining an excellent quantum yield, the content ratio thereof is preferably 0.0001% by mass or greater, more preferably 0.0005% by mass or greater, and still more preferably 0.001% by mass or greater.

The above-described upper limit and lower limit can be combined as desired.

The content ratio of the component (1) to the total mass of the composition is typically in a range of 0.0001% to 50% by mass.

The content ratio of the component (1) to the total mass of the composition is preferably in a range of 0.0001% by mass to 1% by mass, more preferably in a range of 0.0005% by mass to 1% by mass, and still more preferably in a range of 0.001% by mass to 0.5% by mass.

In the composition according to the present embodiment, the composition in which the content ratio of the component (1) to the total mass of the composition is in the above-described range is preferable from the viewpoint of making the component (1) difficult to aggregate and exhibiting an excellent light-emitting property.

In the composition according to the embodiment which contains the component (1) and the component (2) as the essential components and at least one selected from the group consisting of the component (3) and the component (4), the content ratio of the component (2) to the total mass of the composition is not particularly limited as long as the effects of the present invention are exhibited. In the composition according to the present embodiment, from the viewpoint of obtaining a high quantum yield and obtaining a high absorption rate, it is preferable that the content ratio of the component (2) to the total mass of the composition is in the range described below.

Specifically, the content ratio thereof is preferably 30% by mass or less, more preferably 20% by mass or less, and still more preferably 10% by mass or less. Further, from the viewpoint of obtaining an excellent quantum yield and obtaining a high absorption rate, the content ratio thereof is preferably 0.01% by mass or greater, more preferably 0.1% by mass or greater, and still more preferably 0.5% by mass or greater. The above-described upper limit and lower limit can be combined as desired.

The content ratio of the component (2) to the total mass of the composition is typically in a range of 0.01% to 30% by mass.

The content ratio of the component (2) to the total mass of the composition is preferably in a range of 0.1% by mass to 20% by mass, more preferably in a range of 0.5% by mass to 10% by mass, and still more preferably in a range of 1% by mass to 8% by mass.

In the composition according to the present embodiment, the composition in which the content ratio of the component (2) to the total mass of the composition is in the above-described range is preferable from the viewpoint of obtaining a high quantum yield and obtaining a high absorption rate.

In the composition according to the embodiment which contains the component (1) and the component (2) as the essential components and at least one selected from the group consisting of the component (3) and the component (4), the total content ratio of the component (1) and the component (2) to the total mass of the composition is not particularly limited as long as the effects of the present invention are exhibited. In the composition according to the present embodiment, from the viewpoint of making the perovskite compound difficult to aggregate and preventing the concentration quenching, it is preferable that the total content ratio of the component (1) and the component (2) to the total mass of the composition is in the range described below.

Specifically, the content ratio thereof is preferably 60% by mass or less, more preferably 40% by mass or less, still more preferably 30% by mass or less, and particularly preferably 20% by mass or less. Further, from the viewpoint of obtaining an excellent quantum yield, the content ratio thereof is preferably 1% by mass or greater, more preferably 3% by mass or greater, and still more preferably 4% by mass or greater.

The above-described upper limit and lower limit can be combined as desired.

The total content ratio of the component (1) and the component (2) to the total mass of the composition is typically in a range of 1% to 60% by mass.

The total content ratio of the component (1) and the component (2) to the total mass of the composition is preferably in a range of 2% to 40% by mass, more preferably in a range of 3% to 30% by mass, and still more preferably in a range of 4% to 20% by mass.

In the composition according to the present embodiment, the composition in which the total content ratio of the component (1) and the component (2) to the total mass of the composition is in the above-described range is preferable from the viewpoint of making the component (1) difficult to aggregate and exhibiting an excellent light-emitting property.

In the composition according to the embodiment which contains the component (1), the component (2), and the component (4') as the essential components and the total content ratio of the component (1), the component (2), and the component (4') is 90% by mass or greater with respect to the total mass of the composition, the content ratio of the component (1) to the total mass of the composition is not particularly limited as long as the effects of the present invention are exhibited. In the present embodiment, from the viewpoint of making the component (1) difficult to aggregate and preventing the concentration quenching, the content ratio of the component (1) to the total mass of the composition is preferably 50% by mass or less, more preferably 1% by mass or less, and still more preferably 0.5% by mass or less. Further, from the viewpoint of obtaining excellent emission intensity, the content ratio of the component (1) to the total mass of the composition is preferably 0.0001% by mass or greater, more preferably 0.0005% by mass or greater, and still more preferably 0.001% by mass or greater.

The above-described upper limit and lower limit can be combined as desired.

The content ratio of the component (1) to the total mass of the composition is typically in a range of 0.0001% to 50% by mass.

The content ratio of the component (1) to the total mass of the composition is preferably in a range of 0.0001% by mass to 1% by mass, more preferably in a range of 0.0005% by mass to 1% by mass, and still more preferably in a range of 0.001% by mass to 0.5% by mass.

In the composition according to the present embodiment, the composition in which the content ratio of the component (1) to the total mass of the composition is in the above-described range is preferable from the viewpoint of exhibiting an excellent light-emitting property.

In the composition according to the embodiment which contains the component (1), the component (2), and the component (4') as the essential components and the total content ratio of the component (1), the component (2), and the component (4') is 90% by mass or greater with respect to the total mass of the composition, the content ratio of the component (2) to the total mass of the composition is not particularly limited as long as the effects of the present invention are exhibited.

In the present embodiment, from the viewpoint of obtaining a high quantum yield and obtaining a high absorption rate, the content ratio of the component (2) to the total mass of the composition is preferably 30% by mass or less, more preferably 20% by mass or less, and still more preferably 10% by mass or less. Further, from the viewpoint of obtaining a high quantum yield and obtaining a high absorption rate, the content ratio of the component (2) to the total mass of the composition is preferably 0.01% by mass or greater, more preferably 0.1% by mass or greater, and still more preferably 0.5% by mass or greater.

The above-described upper limit and lower limit can be combined as desired.

The content ratio of the component (2) to the total mass of the composition is typically in a range of 0.01% to 30% by mass.

The content ratio of the component (2) to the total mass of the composition is preferably in a range of 0.1% by mass to 20% by mass, more preferably in a range of 0.5% by mass to 10% by mass, and still more preferably in a range of 1% by mass to 8% by mass.

In the composition according to the present embodiment, the composition in which the content ratio of the component (2) to the total mass of the composition is in the above-described range is preferable from the viewpoint of obtaining a high quantum yield and obtaining a high absorption rate.

In the composition according to the embodiment which contains the component (1), the component (2), and the component (4') as the essential components and the total content ratio of the component (1), the component (2), and the component (4') is 90% by mass or greater with respect to the total mass of the composition, the total content ratio of the component (1) and the component (2) to the total mass of the composition is not particularly limited as long as the effects of the present invention are exhibited. In the present embodiment, from the viewpoint of making the component (1) difficult to aggregate and preventing the concentration quenching, the total content ratio of the component (1) and the component (2) to the total mass of the composition is preferably 60% by mass or less, more preferably 40% by mass or less, still more preferably 30% by mass or less, and particularly preferably 20% by mass or less. Further, from the viewpoint of obtaining a high quantum yield, the total content ratio of the component (1) and the component (2) to the total mass of the composition is preferably 1% by mass or greater, more preferably 2% by mass or greater, and still more preferably 4% by mass or greater.

The above-described upper limit and lower limit can be combined as desired.

The total content ratio of the component (1) and the component (2) to the total mass of the composition is typically in a range of 1% to 60% by mass.

The total content ratio of the component (1) and the component (2) to the total mass of the composition is preferably in a range of 2% to 40% by mass, more preferably in a range of 3% to 30% by mass, and still more preferably in a range of 4% to 20% by mass.

In the composition according to the present embodiment, the composition in which the total content ratio of the component (1) and the component (2) to the total mass of the composition is in the above-described range is preferable from the viewpoint of exhibiting an excellent light-emitting property.

Hereinafter, the composition will be described based on embodiments of the present invention.

<<<Component (1)>>>

The component (1) is a compound including constituent components A, B, and X and having a perovskite type crystal structure (hereinafter, also referred to as a "perovskite compound").

Hereinafter, the component (1) will be described.

The perovskite compound contained in the composition of the present embodiment is a compound which includes constituent components A, B, and X and has a perovskite type crystal structure.

The constituent component A indicates a component positioned at each vertex of a hexahedron having the constituent component B at the center in a perovskite type crystal structure and is a monovalent cation.

The constituent component X indicates a component positioned at each vertex of an octahedron having the constituent component B at the center in the perovskite type crystal structure and is at least one anion selected from the group consisting of a halide ion and a thiocyanate ion.

The constituent component B indicates a component positioned at the centers of the hexahedron where the constituent component A is disposed at each vertex and the octahedron where the constituent component X is disposed at each vertex in the perovskite type crystal structure and is a metal ion.

The perovskite compound having the constituent components A, B, and X is not particularly limited as long as the effects of the present invention are exhibited and may be a compound having any of a three-dimensional structure, a two-dimensional structure, and a quasi-two-dimensional structure.

According to an aspect of the present invention, a compound having a three-dimensional structure is preferable as the perovskite compound having the constituent components A, B, and X.

In a case of the three-dimensional structure, the compositional formula of the perovskite compound is $ABX_{(3+\delta)}$.

In a case of the two-dimensional structure, the compositional formula of the perovskite compound is $A_2BX_{(4+\delta)}$.

Here, the parameter $\delta$ is a number which can be appropriately changed according to the charge balance of B and is in a range of −0.7 to 0.7. From the viewpoint of stabilizing the crystal structure, the parameter is preferably in a range of −0.3 to 0.3, more preferably in a range of −0.1 to 0.1, and still more preferably 0.

As the perovskite compound, a perovskite compound represented by Formula (1) is preferable.

$$ABX_{(3+\delta)} (-0.7 \le \delta \le 0.7) \quad (1)$$

The constituent component A indicates a component positioned at each vertex of a hexahedron having the constituent component B at the center in a perovskite type crystal structure and is a monovalent cation.

The constituent component X indicates a component positioned at each vertex of an octahedron having the constituent component B at the center in the perovskite type crystal structure and is one or more kinds of anions selected from the group consisting of a halide ion and a thiocyanate ion.

The constituent component B indicates a component positioned at the centers of the hexahedron where the constituent component A is disposed at each vertex and the octahedron where the constituent component X is disposed at each vertex in the perovskite type crystal structure and is a metal ion.

[A]

In the perovskite compound, the constituent component A indicates a component positioned at each vertex of a hexahedron having the constituent component B at the center in a perovskite type crystal structure and is a monovalent cation.

Examples of the monovalent cation include a cesium ion, an organic ammonium ion, and an amidinium ion. In a case where the constituent component A is a cesium ion, an organic ammonium ion having 3 or less carbon atoms, or an amidinium ion having 3 or less carbon atoms in the perovskite compound, the perovskite compound typically has a three-dimensional structure represented by $ABX_{(3+\delta)}$.

As the constituent component A in the perovskite compound, a cesium ion or an organic ammonium ion is preferable and a cesium ion is more preferable.

The content ratio of the cesium ion in a case where the total number of moles in the perovskite compound is set to 100% by mole is preferably in a range of 10% to 130% by mole and more preferably in a range of 70% to 120% by mole.

Specific examples of the organic ammonium ion as the constituent component A include a cation represented by Formula (A3).

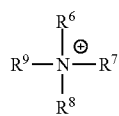

(A3)

In Formula (A3), $R^6$ to $R^9$ each independently represent a hydrogen atom, an alkyl group which may contain an amino group as a substituent, or a cycloalkyl group which may contain an alkyl group or an amino group as a substituent. Here, not all of $R^6$ to $R^9$ simultaneously represent hydrogen atoms.

The alkyl group represented by each of independent $R^6$ to $R^9$ may be linear or branched and may have an amino group as a substituent.

In a case where $R^6$ to $R^9$ represent an alkyl group, the number of carbon atoms of each of independent $R^6$ to $R^9$ is typically in a range of 1 to 20, preferably in a range of 1 to 4, still more preferably in a range of 1 to 3, and even still more preferably 1.

The cycloalkyl group represented by each of independent $R^6$ to $R^9$ may contain an alkyl group or an amino group as a substituent.

The number of carbon atoms of the cycloalkyl group represented by each of independent $R^6$ to $R^9$ is typically in a range of 3 to 30, preferably in a range of 3 to 11, and more preferably in a range of 3 to 8. The number of carbon atoms include the number of carbon atoms in a substituent.

As the group represented by each of independent $R^6$ to $R^9$, a hydrogen atom or an alkyl group is preferable.

A compound having a perovskite type crystal structure of a three-dimensional structure with high emission intensity can be obtained by decreasing the number of alkyl groups and cycloalkyl groups which can be included in Formula (A3) and decreasing the number of carbon atoms in the alkyl group and the cycloalkyl group.

In a case where the number of carbon atoms in the alkyl group or the cycloalkyl group is 4 or more, a compound partially or entirely having a two-dimensional and/or quasi-two-dimensional (quasi-2D) perovskite type crystal structure can be obtained. In a case where a two-dimensional perovskite type crystal structure is laminated at infinity, the structure becomes the same as the three-dimensional perovskite type crystal structure (reference literature: for example, P. P. Boix et al., J. Phys. Chem. Lett. 2015, 6, 898 to 907).

The total number of carbon atoms in the alkyl group as $R^6$ to $R^9$ is preferably in a range of 1 to 4, and the total number of carbon atoms in the cycloalkyl group as $R^6$ to $R^9$ is preferably 3 or 4. It is more preferable that one of $R^6$ to $R^9$ represents an alkyl group having 1 to 3 carbon atoms and three of $R^6$ to $R^9$ represent a hydrogen atom.

Examples of the alkyl group as $R^6$ to $R^9$ include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a tert-pentyl group, a 1-methylbutyl group, an n-hexyl group, a 2-methylpentyl group, a 3-methylpentyl group, a 2,2-dimethylbutyl group, a 2,3-dimethylbutyl group, an n-heptyl group, a 2-methylhexyl group, a 3-methylhexyl group, a 2,2-dimethylpentyl group, a 2,3-dimethylpentyl group, a 2,4-dimethylpentyl group, a 3,3-dimethylpentyl group, a 3-ethylpentyl group, a 2,2,3-trimethylbutyl group, an n-octyl group, an isooctyl group, a 2-ethylhexyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an icosyl group.

Among these, a methyl group or an ethyl group is preferable, and an ethyl group is more preferable as the alkyl group represented by $R^6$ to $R^9$.

As the cycloalkyl group as $R^6$ to $R^9$, a group in which an alkyl group having 3 or more carbon atoms which has been provided as an exemplary example of the alkyl group represented by each of independent $R^6$ to $R^9$ forms a ring is an exemplary example, and examples thereof include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, a 2-adamantyl group, and a tricyclodecyl group.

As the organic ammonium ion represented by A, $CH_3NH_3^+$ (also referred to as a methylammonium ion), $C_2H_5NH_3^+$ (also referred to as an ethylammonium ion), or $C_3H_7NH_3^+$ (also referred to as a propylammonium ion) is preferable, $CH_3NH_3^+$ or $C_2H_5NH_3^+$ is more preferable, $CH_3NH_3^+$ is still more preferable.

As the amidinium ion represented by A, an amidinium ion represented by Formula (A4) is an exemplary example.

$(R^{10}R^{11}N=CH-NR^{12}R^{13})^+$ (A4)

In Formula (A4), $R^{10}$ to $R^{13}$ each independently represent a hydrogen atom, an alkyl group which may contain an amino group as a substituent, or a cycloalkyl group which may contain an alkyl group or an amino group as a substituent.

The alkyl group represented by each of independent $R^{10}$ to $R^{13}$ may be linear or branched and may have an amino group as a substituent.

The number of carbon atoms in the alkyl group represented by each of independent $R^{10}$ to $R^{13}$ is typically in a range of 1 to 20, preferably in a range of 1 to 4, and still more preferably in a range of 1 to 3.

The cycloalkyl group represented by each of independent $R^{10}$ to $R^{13}$ may contain an alkyl group or an amino group as a substituent.

The number of carbon atoms of the cycloalkyl group represented by each of independent $R^{10}$ to $R^{13}$ is typically in a range of 3 to 30, preferably in a range of 3 to 11, and more preferably in a range of 3 to 8. The number of carbon atoms include the number of carbon atoms in a substituent.

Specific examples of the alkyl group as $R^{10}$ to $R^{13}$ are the same as those provided as exemplary examples of the alkyl group represented by each of independent $R^6$ to $R^9$.

Among these, a methyl group or an ethyl group is preferable, and an methyl group is more preferable as the alkyl group represented by $R^{10}$ to $R^{13}$.

Specific examples of the cycloalkyl group as $R^{10}$ to $R^{13}$ are the same as those provided as exemplary examples of the cycloalkyl group represented by each of independent $R^6$ to $R^9$.

As the group represented by each of independent $R^{10}$ to $R^{13}$, a hydrogen atom or an alkyl group is preferable.

A perovskite compound having a three-dimensional structure with high emission intensity can be obtained by decreasing the number of alkyl groups and cycloalkyl groups which can be included in Formula (A4) and decreasing the number of carbon atoms in the alkyl group and the cycloalkyl group.

In a case where the number of carbon atoms in the alkyl group or the cycloalkyl group is 4 or more, a compound partially or entirely having a two-dimensional and/or quasi-two-dimensional (quasi-2D) perovskite type crystal structure can be obtained. Further, the total number of carbon atoms in the alkyl group as $R^{10}$ to $R^{13}$ is preferably in a range of 1 to 4, and the total number of carbon atoms in the cycloalkyl group as $R^{10}$ to $R^{13}$ is preferably 3 or 4. It is more preferable that $R^{10}$ represents an alkyl group having 1 to 3 carbon atoms and $R^1$ to $R^{13}$ represent a hydrogen atom.

[B]

In the perovskite compound, the constituent component B indicates a component positioned at the centers of the hexahedron where the constituent component A is disposed at each vertex and the octahedron where the constituent component X is disposed at each vertex in the perovskite type crystal structure and is a metal ion. The metal ion as the constituent component B may be a metal ion formed of at least one selected from the group consisting of a monovalent metal ion, a divalent metal ion, and a trivalent metal ion. It is preferable that the constituent component B contains a divalent metal ion and more preferable that the constituent component B contains at least one metal ion selected from the group consisting of lead and tin.

[X]

In the perovskite compound, the constituent component X indicates a component positioned at each vertex of an octahedron having the constituent component B at the center in the perovskite type crystal structure and is at least one anion selected from the group consisting of a halide ion and a thiocyanate ion. The constituent component X may be at least one anion selected from the group consisting of a chloride ion, a bromide ion, a fluoride ion, an iodide ion, and a thiocyanate ion.

The constituent component X can be appropriately selected according to a desired emission wavelength. For example, the constituent component X may contain a bromide ion.

In a case where the constituent component X is two or more kinds of halide ions, the content ratio of the halide ions can be appropriately selected according to the emission wavelength. For example, a combination of a bromide ion and a chloride ion or a combination of a bromide ion and an iodide ion can be employed.

In the case where the perovskite compound has the three-dimensional structure, the structure has a three-dimensional network of a vertex-sharing octahedron which has B as the center and X as a vertex and is represented by $BX_6$.

In the case where the perovskite compound has the two-dimensional structure, a structure in which a layer formed of two-dimensionally connected $BX_6$ and a layer formed of A are alternately laminated is formed in a case where the octahedron which has B as the center and X as a vertex and is represented by $BX_6$ shares Xs of four vertexes in the same plane.

B represents a metal cation which can have octahedral coordination of X.

In the present specification, the perovskite structure can be confirmed by an X-ray diffraction pattern.

In a case of the compound having the perovskite type crystal structure of the three-dimensional structure, typically, a peak derived from (hkl)=(001) is confirmed at a position where 2θ is in a range of 12° to 180 or a peak derived from (hkl)=(110) is confirmed at a position where 2θ is in a range of 18° to 25° in the X ray diffraction pattern measured using Cu Kα rays.

It is more preferable that a peak derived from (hkl)=(001) is confirmed at a position where 2θ is in a range of 13° to 160 or a peak derived from (hkl)=(110) is confirmed at a position where 2θ is in a range of 20° to 23°.

According to an aspect of the present invention, the content ratio of the compound having the perovskite type crystal structure of the three-dimensional structure to the total mass of the perovskite compound which is the component (1) is preferably in a range of 10% to 100% by mass and more preferably in a range of 70% to 100% by mass.

In a case of the compound having the perovskite type crystal structure of the two-dimensional structure, typically, a peak derived from (hkl)=(002) is confirmed at a position where 2θ is in a range of 1° to 100 in the X ray diffraction pattern measured using Cu Kα rays. It is more preferable that a peak derived from (hkl)=(002) is confirmed at a position where 2θ is in a range of 2° to 8°.

Specific preferred examples of the compound which is represented by $ABX_{(3+δ)}$ and has the perovskite type crystal structure of the three-dimensional structure in the perovskite compound include $CH_3NH_3PbBr_3$, $CH_3NH_3PbCl_3$, $CH_3NH_3PbI_3$, $CH_3NH_3PbBr_{(3-y)}I_y$ (0<y<3), $CH_3NH_3PbBr_{(3-y)}Cl_y$ (0<y<3), $(H_2N=CH-NH_2)PbBr_3$, $(H_2N=CH-NH_2)PbCl_3$, $(H_2N=CH-NH_2)PbI_3$, $CH_3NH_3Pb_{(1-a)}Ca_aBr_3$ (0<a≤0.7), $CH_3NH_3Pb_{(1-a)}Sr_aBr_3$ $(0<a≤0.7)$, $CH_3NH_3Pb_{(1-a)}La_aBr_{(3+δ)}$ $(0<a≤0.7, 0<δ≤0.7)$, $CH_3NH_3Pb_{(1-a)}Ba_aBr_3$ $(0<a≤0.7)$, $CH_3NH_3Pb_{(1-a)}Dy_aBr_{(3+δ)}$ $(0<a≤0.7, 0<δ≤0.7)$, $CH_3NH_3Pb_{(1-a)}Na_aBr_{(3+δ)}$ $(0<a≤0.7, -0.7≤δ<0)$, $CH_3NH_3Pb_{(1-a)}Li_aBr_{(3+δ)}$ $(0<a≤0.7, -0.7≤δ<0)$, $CsPb_{(1-a)}Na_aBr_{(3+δ)}$ $(0<a≤0.7, -0.7≤δ<0)$, $CsPb_{(1-a)}Li_aBr_{(3+δ)}$ $(0<a≤0.7, -0.7≤δ<0)$, $CH_3NH_3Pb_{(1-a)}Na_aBr_{(3+δ-y)}I_y$ $(0<a≤0.7, -0.7≤δ<0, 0<y<3)$, $CH_3NH_3Pb_{(1-a)}Li_aBr_{(3+δ-y)}I_y$ $(0<a≤0.7, -0.7≤δ<0, 0<y<3)$, $CH_3NH_3Pb_{(1-a)}Na_aBr_{(3+δ-y)}Cl_y$ $(0<a≤0.7, -0.7≤δ<0, 0<y<3)$, $CH_3NH_3Pb_{(1-a)}Li_aBr_{(3+δ-y)}Cl_y$ $(0<a≤0.7, -0.7≤δ<0, 0<y<3)$, $(H_2N=CH-NH_2)Pb_{(1-a)}Na_aBr_{(3+δ)}$ $(0<a≤0.7, -0.7≤δ<0)$, $(H_2N=CH-NH_2)Pb_{(1-a)}Li_aBr_{(3+δ)}$ $(0<a≤0.7, -0.7≤δ<0)$, $(H_2N=CH-NH_2)Pb_{(1-a)}Na_aBr_{(3+δ-y)}I_y$ $(0<a≤0.7, -0.7≤δ<0, 0<y<3)$, $(H_2N=CH-NH_2)Pb_{(1-a)}Na_aBr_{(3+δ-y)}Cl_y$ $(0<a≤0.7, -0.7≤δ<0, 0<y<3)$, $CsPbBr_3$, $CsPbCl_3$, $CsPbI_3$, $CsPbBr_{(3-y)}I_y$ $(0<y<3)$, $CsPbBr_{(3-y)}Cl_y$ $(0<y<3)$, $CH_3NH_3PbBr_{(3-y)}Cl_y$ $(0<y<3)$, $CH_3NH_3Pb_{(1-a)}Zn_aBr_3$ $(0<a≤0.7)$, $CH_3NH_3Pb_{(1-a)}Al_aBr_{(3+δ)}$ $(0<a≤0.7, 0≤δ≤0.7)$, $CH_3NH_3Pb_{(1-a)}Co_aBr_3$ $(0<a≤0.7)$, $CH_3NH_3Pb_{(1-a)}Mn_aBr_3$ $(0<a≤0.7)$, $CH_3NH_3Pb_{(1-a)}Mg_aBr_3$ $(0<a≤0.7)$, $CsPb_{(1-a)}Zn_aBr_3$ $(0<a≤0.7)$, $CsPb_{(1-a)}Al_aBr_{(3+δ)}$ $(0<a≤0.7, 0<δ≤0.7)$, $CsPb_{(1-a)}Co_aBr_3$ $(0<a≤0.7)$, $CsPb_{(1-a)}Mn_aBr_3$ $(0<a≤0.7)$, $CsPb_{(1-a)}Mg_aBr_3$ $(0<a≤0.7)$, $CH_3NH_3Pb_{(1-a)}Zn_aBr_{(3-y)}I_y$ $(0<a≤0.7, 0<y<3)$, $CH_3NH_3Pb_{(1-a)}Al_aBr_{(3+δ-y)}I_y$ $(0<a≤0.7, 0<δ≤0.7, 0<y<3)$, $CH_3NH_3Pb_{(1-a)}Co_aBr_{(3-y)}I_y$ $(0<a≤0.7, 0<y<3)$, $CH_3NH_3Pb_{(1-a)}Mn_aBr_{(3-y)}I_y$ $(0<a≤0.7, 0<y<3)$, $CH_3NH_3Pb_{(1-a)}Mg_aBr_{(3-y)}I_y$ $(0<a≤0.7, 0<y<3)$, $CH_3NH_3Pb_{(1-a)}Zn_aBr_{(3-y)}Cl_y$ $(0<a≤0.7, 0<y<3)$, $CH_3NH_3Pb_{(1-a)}Al_aBr_{(3+δ-y)}Cl_y$ $(0<a≤0.7, 0<δ≤0.7, 0<y<3)$, $CH_3NH_3Pb_{(1-a)}Co_aBr_{(3+δ-y)}Cl_y$ $(0<a≤0.7, 0<y<3)$, $CH_3NH_3Pb_{(1-a)}Mn_aBr_{(3-y)}Cl_y$ $(0<a≤0.7, 0<y<3)$, $CH_3NH_3Pb_{(1-a)}Mg_aBr_{(3-y)}Cl_y$ $(0<a≤0.7, 0<y<3)$, $(H_2N=CH-NH_2)Zn_aBr_3$ $(0<a≤0.7)$, $(H_2N=CH-NH_2)Mg_aBr_3$ $(0<a≤0.7)$, $(H_2N=CH-NH_2)Pb_{(1-a)}Zn_aBr_{(3-y)}I_y$ $(0<a≤0.7, 0<y<3)$, and $(H_2N=CH-NH_2)Pb_{(1-a)}Zn_aBr_{(3-y)}Cl_y$ $(0<a≤0.7, 0<y<3)$.

Specific preferred examples of the compound which is represented by $A_2BX_{(4+δ)}$ and has the perovskite type crystal structure of the two-dimensional structure in the perovskite compound include $(C_4H_9NH_3)_2PbBr_4$, $(C_4H_9NH_3)_2PbCl_4$, $(C_4H_9NH_3)_2PbI_4$, $(C_7H_{15}NH_3)_2PbBr_4$, $(C_7H_{15}NH_3)_2PbCl_4$, $(C_7H_{15}NH_3)_2PbI_4$, $(C_4H_9NH_3)_2Pb_{(1-a)}Li_aBr_{(4+δ)}$ $(0<a≤0.7, -0.7≤δ<0)$, $(C_4H_9NH_3)_2Pb_{(1-a)}Na_aBr_{(4+δ)}$ $(0<a≤0.7, -0.7≤δ<0)$, $(C_4H_9NH_3)_2Pb_{(1-a)}Rb_aBr_{(4+δ)}$ $(0<a≤0.7, -0.7≤δ<0)$, $(C_7H_{15}NH_3)_2Pb_{(1-a)}Na_aBr_{(4+δ)}$ $(0<a≤0.7, -0.7≤δ<0)$, $(C_7H_{15}NH_3)_2Pb_{(1-a)}Li_aBr_{(4+δ)}$ $(0<a≤0.7, -0.7≤δ<0)$, $(C_7H_{15}NH_3)_2Pb_{(1-a)}Rb_aBr_{(4+δ)}$ $(0<a≤0.7, -0.7≤δ<0)$, $(C_4H_9NH_3)_2Pb_{(1-a)}Na_aBr_{(4+δ-y)}I_y$ $(0<a≤0.7, -0.7≤δ<0, 0<y<4)$, $(C_4H_9NH_3)_2Pb_{(1-a)}Li_aBr_{(4+δ-y)}I_y$ $(0<a≤0.7, -0.7≤θ<0, 0<y<4)$, $(C_4H_9NH_3)_2Pb_{(1-a)}Rb_aBr_{(4+δ-y)}I_y$ $(0<a≤0.7, -0.7≤δ<0, 0<y<4)$, $(C_4H_9NH_3)_2Pb_{(1-a)}Na_aBr_{(4+δ-y)}Cl_y$ $(0<a≤0.7, -0.7≤δ<0, 0<y<4)$, $(C_4H_9NH_3)_2Pb_{(1-a)}Li_aBr_{(4+δ-y)}Cl_y$ $(0<a≤0.7, -0.7≤δ<0, 0<y<4)$, $(C_4H_9NH_3)_2Pb_{(1-a)}Rb_aBr_{(4+δ-y)}Cl_y$ $(0<a≤0.7, -0.7≤δ<0, 0<y<4)$, $(C_4H_9NH_3)_2PbBr_4$, $(C_7H_{15}NH_3)_2PbBr_4$, $(C_4H_9NH_3)_2PbBr_{(4-y)}Cl_y$ $(0<y<4)$, $(C_4H_9NH_3)_2PbBr_{(4-y)}I_y$ $(0<y<4)$, $(C_4H_9NH_3)_2Pb_{(1-a)}Zn_aBr_4$ $(0<a≤0.7)$, $(C_4H_9NH_3)_2Pb_{(1-a)}Mg_aBr_4$ $(0<a≤0.7)$, $(C_4H_9NH_3)_2Pb_{(1-a)}Co_aBr_4$ $(0<a≤0.7)$, $(C_4H_9NH_3)_2Pb_{(1-a)}Mn_aBr_4$ $(0<a≤0.7)$, $(C_7H_{15}NH_3)_2Pb_{(1-a)}Zn_aBr_4$ $(0<a≤0.7)$, $(C_7H_{15}NH_3)_2Pb_{(1-a)}Mg_aBr_4$ $(0<a≤0.7)$, $(C_7H_{15}NH_3)_2Pb_{(1-a)}Co_aBr_4$ $(0<a≤0.7)$, $(C_7H_{15}NH_3)_2Pb_{(1-a)}Mn_aBr_4$ $(0<a≤0.7)$, $(C_4H_9NH_3)_2Pb_{(1-a)}Zn_aBr_{(4-y)}I_y$ $(0<a≤0.7, 0<y<4)$, $(C_4H_9NH_3)_2Pb_{(1-a)}Mg_aBr_{(4-y)}I_y$ $(0<a≤0.7, 0<y<4)$, $(C_4H_9NH_3)_2Pb_{(1-a)}Co_aBr_{(4-y)}I_y$ $(0<a≤0.7, 0<y<4)$, $(C_4H_9NH_3)_2Pb_{(1-a)}Mn_aBr_{(4-y)}I_y$ $(0<a≤0.7, 0<y<4)$, $(C_4H_9NH_3)_2Pb_{(1-a)}Zn_aBr_{(4-y)}Cl_y$ $(0<a≤0.7, 0<y<4)$, $(C_4H_9NH_3)_2Pb_{(1-a)}Mg_aBr_{(4-y)}Cl_y$ $(0<a≤0.7, 0<y<4)$, $(C_4H_9NH_3)_2Pb_{(1-a)}Co_aBr_{(4-y)}Cl_y$ $(0<a≤0.7, 0<y<4)$, and $(C_4H_9NH_3)_2Pb_{(1-a)}Mn_aBr_{(4-y)}Cl_y$ $(0<a≤0.7, 0<y<4)$.

According to an aspect of the present invention, as the compound which is the perovskite compound and has the perovskite type crystal structure of the three-dimensional structure represented by $ABX_{(3+δ)}$, $CsPbBr_3$ is preferable.

Emission Spectrum

The perovskite compound is a light emitting material which is capable of emitting fluorescence in a visible light wavelength range.

In a case where the constituent component X is a bromide ion, the perovskite compound is capable of emitting fluorescence having a maximum peak of the emission intensity in a wavelength range of typically 480 nm or greater, preferably 500 nm or greater, and more preferably 510 nm or greater and typically 700 nm or less, preferably 600 nm or less, and more preferably 580 nm or less.

The above-described upper limit and lower limit can be combined as desired.

According to another aspect of the present invention, in the case where the constituent component X a bromide ion, the perovskite compound is capable of emitting fluorescence having a maximum peak of the emission intensity in a wavelength range of typically 480 nm to 700 nm, preferably 500 nm to 600 nm, and more preferably 510 nm to 580 nm.

In a case where the constituent component X is an iodide ion, the perovskite compound is capable of emitting fluorescence having a maximum peak of the emission intensity in a wavelength range of typically 520 nm or greater, preferably 530 nm or greater, and more preferably 540 nm or greater and typically 800 nm or less, preferably 750 nm or less, and more preferably 730 nm or less.

The above-described upper limit and lower limit can be combined as desired.

According to another aspect of the present invention, in the case where the constituent component X is an iodide ion, the perovskite compound is capable of emitting fluorescence having a maximum peak of the emission intensity in a wavelength range of typically 520 nm to 800 nm, preferably 530 nm to 750 nm, and more preferably 540 nm to 730 nm.

In a case where the constituent component X is a chloride ion, the perovskite compound is capable of emitting fluorescence having a maximum peak of the intensity in a wavelength range of typically 300 nm or greater, preferably 310 nm or greater, and more preferably 330 nm or greater and typically 600 nm or less, preferably 580 nm or less, and more preferably 550 nm or less.

The above-described upper limit and lower limit can be combined as desired.

According to another aspect of the present invention, in the case where the constituent component X in the perovskite compound is a chloride ion, the peak of the emitted fluorescence is typically in a range of 300 nm to 600 nm, preferably in a range of 310 nm to 580 nm, and more preferably in a range of 330 nm to 550 nm.

The average particle diameter of the component (1) (primary particles) contained in the composition according to the present embodiment is not particularly limited as long as the effects of the present invention are exhibited. In the composition according to the present embodiment, the average particle diameter of the component (1) is preferably 1 nm or greater, more preferably 2 nm or greater, and still more preferably 3 nm or greater from the viewpoint of satisfactorily maintaining the crystal structure of the component (1). Further, in the composition according to the present embodiment, the average particle diameter of the component (1) is preferably 10 μm or less, more preferably 1 μm or less, and still more preferably 500 nm or less from the viewpoint of making the component (1) difficult to be settled out.

The above-described upper limit and lower limit can be combined as desired.

The average particle diameter of the component (1) (primary particles) contained in the composition according to the present embodiment is not particularly limited, but is preferably in a range of 1 nm to 10 μm, more preferably in a range of 2 nm to 1 μm, and still more preferably 3 nm to 500 nm from the viewpoint of making the component (1) difficult to be settled out in the composition and satisfactorily maintaining the crystal structure.

The average particle diameter of the component (1) (primary particles) can be obtained by employing the average value of the particle diameters of twenty primary particles. The particle diameter of each primary particle is obtained by measuring the vertical length and the horizontal length of a rectangle circumscribing the figure of the outer periphery of the primary particle using a transmission electron microscope (hereinafter, also referred to as a "TEM") and setting the larger value (in the present specification, also noted as the "Feret diameter") as the particle diameter.

The median diameter ($D_{50}$) of the component (1) (primary particles) contained in the composition according to the present embodiment is not particularly limited as long as the effects of the present invention are exhibited. In the composition according to the present embodiment, the median diameter $D_{50}$ of the component (1) is preferably 3 nm or greater, more preferably 4 nm or greater, and still more preferably 5 nm or greater from the viewpoint of satisfactorily maintaining the crystal structure of the component (1). Further, in the composition according to the present embodiment, the median diameter ($D_{50}$) of the component (1) is preferably 5 μm or less, more preferably 500 nm or less, and still more preferably 100 nm or less from the viewpoint of making the component (1) difficult to be settled out. According to another aspect of the present invention, the median diameter ($D_{50}$) of the component (1) contained in the composition is preferably in a range of 3 nm to 5 μm, more preferably in a range of 4 nm to 500 nm, and still more preferably in a range of 5 nm to 100 nm.

In the present specification, the median diameter of the component (1) contained in the composition can be measured using, for example, a TEM or a scanning electron microscope (hereinafter, also referred to as an SEM). Specifically, the median diameter ($D_{50}$) thereof can be acquired based on distribution of the Feret diameters of twenty components (1) contained in the composition observed using a TEM or a SEM.

<<Component (2)>>

The component (2) is inorganic fine particles having a specific surface area of 0.01 $m^2$/g to 150 $m^2$/g.

From the viewpoint that the perovskite compound efficiently absorbs light passing through the composition, the number of defect sites in the perovskite compound is reduced without deteriorating the perovskite compound, and the probability of excited electrons trapping the defect sites is reduced, the specific surface area thereof is preferably in a range of 0.05 $m^2$/g to 100 $m^2$/g, more preferably in a range of 0.1 $m^2$/g to 70 $m^2$/g, still more preferably in a range of 0.1 $m^2$/g to 30 $m^2$/g, particularly preferably in a range of 0.4 $m^2$/g to 15 $m^2$/g, and most preferably in a range of 0.4 $m^2$/g to 10 $m^2$/g.

The specific surface area of the component (2) can be measured using a specific surface area measuring device (for example, Macsorb, manufactured by Mountech Co., Ltd.) according to the following BET method.

It is preferable that the inorganic fine particles of the component (2) is crystalline inorganic fine particles. Here, the component (2) is different from the component (1). That is, the component (2) is inorganic fine particles having a specific surface area of 0.01 $m^2$/g to 150 $m^2$/g other than the perovskite compound containing the constituent components A, B, and X. The crystalline inorganic fine particles here indicates particles in which elements constituting the inorganic fine particles are regularly arranged and have a crystal structure.

The inorganic fine particles may be commercially available.

In a case where the inorganic fine particles is a nitride, the nitride may be obtained by mixing raw materials such as a nitrate, a chloride salt, and a sulfate constituting the inorganic fine particles with a raw material containing nitrogen, firing the mixture, and nitriding the resultant.

In a case where the inorganic fine particles is a carbide, the carbide may be obtained by mixing raw materials such as a nitrate, a chloride salt, and a sulfate constituting the inorganic fine particles with a raw material containing carbon, firing the mixture, and carbonizing the resultant.

In a case where the inorganic fine particles is an oxide, the oxide may be obtained by firing raw materials such as a nitrate, a chloride salt, and a sulfate constituting the inorganic fine particles and oxidizing the fired raw material.

In a case where the inorganic fine particles is aluminum oxide, the aluminum oxide may be commercially available. The aluminum oxide may be obtained by firing raw materials such as aluminum nitrate, aluminum chloride, aluminum hydroxide, and aluminum alkoxide.

In a case where the inorganic fine particles is niobium oxide, the niobium oxide may be commercially available. The niobium oxide may be obtained by firing raw materials such as niobium chloride and niobium alkoxide.

In a case where the inorganic fine particles is zinc oxide, the zinc oxide may be commercially available. The zinc oxide may be obtained by firing raw materials such as zinc chloride, zinc nitrate, and zinc sulfate.

Examples of a method for setting the specific surface area of the inorganic particles of the component (2) to be in a range of 0.01 $m^2$/g to 150 $m^2$/g include a method for performing the firing in a firing temperature range of 100° C. to 1900° C. during the production of the inorganic particles of the component (2).

The firing temperature is preferably in a range of 200° C. to 1800° C. and preferably in a range of 500° C. to 1300° C. from the viewpoint of sufficient oxidation.

From the viewpoint of sufficient oxidation, an atmosphere containing oxygen is preferable as the firing atmosphere.

Further, it has been already confirmed that the specific surface area of the inorganic fine particles serving as the component (2) does not change before and after the composition is obtained according to the following production method. The specific surface area of the component (2) in the composition can be measured after the component (2) is separated from the component (1), the component (3), the component (4), the component (4'), and the like. Examples of the separation of the component (2) from the component (1) include a method for dissolving the component (1) using a good solvent such as N,N-dimethylformamide, performing solid-liquid separation through filtration or the like, and performing washing or drying as necessary. Examples of the separation of the component (2) from the component (3) and the component (4) include a method for performing solid-liquid separation through filtration or the like and performing washing or drying as necessary. Examples of the separation of the component (2) from the component (4') include a method for performing firing to remove the component (4').

In the present specification, the crystallinity of the inorganic fine particles can be confirmed based on the presence or absence of a peak derived from the crystal structure of a diffraction pattern resulting from the X-ray diffraction and can be measured using an X-ray diffraction measuring device (XRD, Cu Kα rays, X'pert PRO MPD, manufactured by Spectris plc).

In a case where the crystalline inorganic fine particles contains aluminum oxide (α-alumina), peaks derived from α-alumina can be confirmed at positions where 2θ is 35°, 43°, and 57°.

In a case where the crystalline inorganic fine particles contains zinc oxide (ZnO), peaks derived from crystalline zinc oxide can be confirmed at positions where 2θ is 32°, 34°, and 36°.

In a case where the crystalline inorganic fine particles contains niobium oxide ($Nb_2O_5$), peaks derived from crystalline niobium oxide can be confirmed at positions where 2θ is 27°, 28°, and 37°.

According to an aspect of the present invention, the content of the crystalline inorganic fine particles is preferably in a range of 10% to 100% by mass, more preferably in a range of 30% to 100% by mass, and still more preferably in a range of 80% to 100% by mass with respect to the total mass of the component (2).

Examples of the inorganic fine particles in the component (2) include fine particles containing known inorganic compounds such as an oxide, a hydroxide, a sulfide, a nitride, a carbide, a chloride, a bromide, an iodide, and fluoride. Among these, from the viewpoint that the perovskite compound efficiently absorbs light passing through the composition, the number of defect sites in the perovskite compound is reduced without deteriorating the perovskite compound, and the probability of excited electrons trapping the defect sites is reduced, an oxide is preferable.

The component (2) may contain organic matter, as impurities, such as a small amount of adsorbed moisture, interlayer moisture, crystal moisture, unreacted materials derived from raw materials at the time of synthesis of an inorganic compound, a pyrolysate, and a combustion substance, in addition to the inorganic compound as a main component.

The content of the inorganic compound is preferably in a range of 30% to 100% by mass, more preferably in a range of 50% to 100% by mass, and still more preferably in a range of 70% to 100% by mass with respect to the total mass of the component (2).

Examples of the oxide contained in the inorganic fine particles in the component (2) include known oxides such as silicon oxide, aluminum oxide, zinc oxide, niobium oxide, zirconium oxide, titanium oxide, magnesium oxide, cesium oxide, yttrium oxide, strontium oxide, barium oxide, calcium oxide, tungsten oxide, indium oxide, and gallium oxide, and mixtures thereof. Among these, aluminum oxide, zinc oxide, or niobium oxide is preferable, aluminum oxide or niobium oxide is more preferable, and niobium oxide is most preferable.

The content ratio of the oxide to the total mass of the component (2) is preferably in a range of 30% to 100% by mass and more preferably in a range of 70% to 100% by mass.

In a case where the component (2) contains aluminum oxide, the content ratio of the aluminum oxide to the total mass of the component (2) is preferably in a range of 30% to 100% by mass and more preferably in a range of 70% to 100% by mass.

In a case where the component (2) contains zinc oxide, the content ratio of the zinc oxide to the total mass of the component (2) is preferably in a range of 30% to 100% by mass and more preferably in a range of 70% to 100% by mass.

In a case where the component (2) contains niobium oxide, the content ratio of the niobium oxide to the total mass of the component (2) is preferably in a range of 30% to 100% by mass and more preferably in a range of 70% to 100% by mass.

Examples of the aluminum oxide contained in the inorganic fine particles in the component (2) include known alumina oxides such as α-alumina, γ-alumina, θ-alumina, δ-alumina, q-alumina, K-alumina, and X-alumina. Among these, from the viewpoint of suppressing deterioration of the component (1), α-alumina or γ-alumina is preferable, and α-alumina is more preferable.

In the component (2), the aluminum oxide may be commercially available, and alumina may be obtained by firing raw materials such as aluminum nitrate, aluminum chloride, and aluminum alkoxide. Examples of the commercially available aluminum oxide include AKP-20 (manufactured by Sumitomo Chemical Co., Ltd.), AKP-30 (manufactured by Sumitomo Chemical Co., Ltd.), AKP-50 (manufactured by Sumitomo Chemical Co., Ltd.), AKP-53 (manufactured by Sumitomo Chemical Co., Ltd.), AKP-3000 (manufactured by Sumitomo Chemical Co., Ltd.), AA-02 (manufactured by Sumitomo Chemical Co., Ltd.), AA-03 (manufactured by Sumitomo Chemical Co., Ltd.), AA-04 (manufactured by Sumitomo Chemical Co., Ltd.), AA-05 (manufactured by Sumitomo Chemical Co., Ltd.), AA-07 (manufactured by Sumitomo Chemical Co., Ltd.), AA-1.5 (manufactured by Sumitomo Chemical Co., Ltd.), AA-3 (manufactured by Sumitomo Chemical Co., Ltd.), and AA-18 (manufactured by Sumitomo Chemical Co., Ltd.). Among these, from the viewpoint of the quantum yield and the absorption rate, AA-02 (manufactured by Sumitomo Chemical Co., Ltd.), AA-3 (manufactured by Sumitomo Chemical Co., Ltd.), AA-18 (manufactured by Sumitomo Chemical Co., Ltd.), AKP-20 (manufactured by Sumitomo Chemical Co., Ltd.), AKP-3000 (manufactured by Sumitomo Chemical Co., Ltd.), AKP-53 (manufactured by Sumitomo Chemical Co., Ltd.), AKP-30 (manufactured by Sumitomo Chemical Co., Ltd.), or AKP-50 (manufactured by Sumitomo Chemical Co., Ltd.) is preferable, and AA-02 (manufactured by Sumitomo Chemical Co., Ltd.), AA-3 (manufactured by Sumitomo Chemical Co., Ltd.), AKP-53 (manufactured by Sumitomo Chemical Co., Ltd.), AKP-3000 (manufactured by Sumitomo Chemical Co., Ltd.), AKP-30 (manufactured by Sumitomo Chemical Co., Ltd.), or AKP-50 (manufactured by Sumitomo Chemical Co., Ltd.) is more preferable.

Examples of the hydroxide contained in the inorganic fine particles in the component (2) include known oxides such as aluminum hydroxide, zinc hydroxide, magnesium hydroxide, cerium hydroxide, yttrium hydroxide, strontium hydroxide, barium hydroxide, calcium hydroxide, indium hydroxide, and gallium hydroxide, and mixtures thereof. Among these, aluminum hydroxide or zinc hydroxide is preferable.

The content ratio of the hydroxide to the total mass of the component (2) is preferably in a range of 30% to 100% by mass and more preferably in a range of 70% to 100% by mass.

Examples of the sulfide contained in the inorganic fine particles in the component (2) include known sulfides such as silicon sulfide, aluminum sulfide, zinc sulfide, niobium sulfide, zirconium sulfide, titanium sulfide, magnesium sulfide, cerium sulfide, yttrium sulfide, strontium sulfide, barium sulfide, calcium sulfide, tungsten sulfide, indium sulfide, and gallium sulfide, and mixtures thereof. Among these, aluminum sulfide, zinc sulfide, or niobium sulfide is preferable, zinc sulfide or niobium sulfide is more preferable, and niobium sulfide is most preferable.

The content ratio of the sulfide to the total mass of the component (2) is preferably in a range of 30% to 100% by mass and more preferably in a range of 70% to 100% by mass.

Examples of the nitride contained in the inorganic fine particles in the component (2) include known nitrides such as silicon nitride, aluminum nitride, zinc nitride, niobium nitride, zirconium nitride, titanium nitride, magnesium nitride, cerium nitride, yttrium nitride, strontium nitride, barium nitride, calcium nitride, tungsten nitride, indium nitride, and gallium nitride, and mixtures thereof. Among these, aluminum nitride, zinc nitride, or niobium nitride is preferable, aluminum nitride or niobium nitride is more preferable, and niobium nitride is most preferable.

The content ratio of the nitride to the total mass of the component (2) is preferably in a range of 30% to 100% by mass and more preferably in a range of 70% to 100% by mass.

Examples of the carbide contained in the inorganic fine particles in the component (2) include known carbides such as silicon carbide, aluminum carbide, zinc carbide, niobium carbide, zirconium carbide, titanium carbide, magnesium carbide, cerium carbide, yttrium carbide, strontium carbide, barium carbide, calcium carbide, tungsten carbide, indium carbide, and gallium carbide, and mixtures thereof. Among these, aluminum carbide, zinc carbide, or niobium carbide is preferable, aluminum carbide or niobium carbide is more preferable, and niobium carbide is most preferable.

The content ratio of the carbide to the total mass of the component (2) is preferably in a range of 30% to 100% by mass and more preferably in a range of 70% to 100% by mass.

Examples of the chloride contained in the inorganic fine particles in the component (2) include known chlorides such as silicon chloride, aluminum chloride, zinc chloride, niobium chloride, zirconium chloride, titanium chloride, magnesium chloride, cerium chloride, yttrium chloride, strontium chloride, barium chloride, calcium chloride, tungsten chloride, indium chloride, and gallium chloride, and mixtures thereof. Among these, aluminum chloride, zinc chloride, or niobium chloride is preferable, aluminum chloride or niobium chloride is more preferable, and niobium chloride is most preferable.

The content ratio of the chloride to the total mass of the component (2) is preferably in a range of 30% to 100% by mass and more preferably in a range of 30% to 100% by mass.

Examples of the bromide contained in the inorganic fine particles in the component (2) include known bromides such as silicon bromide, aluminum bromide, zinc bromide, niobium bromide, zirconium bromide, titanium bromide, magnesium bromide, cerium bromide, yttrium bromide, strontium bromide, barium bromide, calcium bromide, tungsten bromide, indium bromide, and gallium bromide, and mixtures thereof. Among these, aluminum bromide, zinc bromide, or niobium bromide is preferable, aluminum bromide or niobium bromide is more preferable, and niobium bromide is most preferable.

The content ratio of the bromide to the total mass of the component (2) is preferably in a range of 30% to 100% by mass and more preferably in a range of 70% to 100% by mass.

Examples of the iodide contained in the inorganic fine particles in the component (2) include known iodides such as silicon iodide, aluminum iodide, zinc iodide, niobium iodide, zirconium iodide, titanium iodide, magnesium iodide, gallium iodide, cerium iodide, yttrium iodide, strontium iodide, barium iodide, calcium iodide, tungsten iodide, and indium iodide, and mixtures thereof. Among these, aluminum iodide, zinc iodide, or niobium iodide is preferable, aluminum iodide or niobium iodide is more preferable, and niobium iodide is most preferable.

The content ratio of the iodide to the total mass of the component (2) is preferably in a range of 30% to 100% by mass and more preferably in a range of 70% to 100% by mass.

Examples of the fluoride contained in the inorganic fine particles in the component (2) include known fluorides such as silicon fluoride, aluminum fluoride, zinc fluoride, niobium fluoride, zirconium fluoride, titanium fluoride, magnesium fluoride, cerium fluoride, yttrium fluoride, strontium fluoride, barium fluoride, calcium fluoride, tungsten fluoride, indium fluoride, and gallium fluoride, and mixtures thereof. Among these, aluminum fluoride, zinc fluoride, or niobium fluoride is preferable, aluminum fluoride or niobium fluoride is more preferable, and niobium fluoride is most preferable.

The content ratio of the fluoride to the total mass of the component (2) is preferably in a range of 30% to 100% by mass and more preferably in a range of 70% to 100% by mass.

The average particle diameter of the component (2) used in the composition according to the embodiment of the present invention is not particularly limited, but is preferably in a range of 100 nm to 100 μm. Further, from the viewpoint that the perovskite compound efficiently absorbs light passing through the composition, the number of defect sites in the perovskite compound is reduced without deteriorating the perovskite compound, and the probability of excited electrons trapping the defect sites is reduced, the average particle diameter thereof is more preferably in a range of 150 nm to 30 μm, still more preferably in a range of 160 nm to 10 μm, and particularly preferably in a range of 170 nm to 5 μm.

The shape of the component (2) is not particularly limited.

The average particle diameter of the component (2) indicates the average value of the particle diameters of a plurality of particles of the component (2). As the average particle diameter, the particle diameter of a particle (hereinafter, also referred to as a primary particle) is employed in a case where one particle of the component (2) is present alone, and the particle diameter of a particle (hereinafter, also referred to as a secondary particle) is employed in a case where particles of the component (2) are present as an aggregate.

The average particle diameter of the component (2) used in the composition can be measured using a scattering particle size distribution measuring device.
For example, the average particle diameter of the component (2) can be set as the particle diameter of d50 at the time of measurement of the particle size distribution using the scattering particle size distribution measuring device.

As the method for measuring the average particle diameter of the component (2) in the composition according to the embodiment of the present invention, a method for performing observation using a scanning electron microscope (SEM) or a TEM is an exemplary example.

Further, the detailed element distribution can be analyzed by performing EDX measurement using an SEM or a TEM.

The bulk density (heavy) of the component (2) used in the composition according to the embodiment of the present invention is not particularly limited, but may be in a range of 0.01 g/cm$^3$ to 5 g/cm$^3$. Further, from the viewpoint of improving the light-emitting property, the bulk density thereof is preferably in a range of 0.4 g/cm$^3$ to 4 g/cm$^3$ and more preferably in a range of 0.7 g/cm$^3$ to 2.5 g/cm$^3$.

In the component (2), for example, the bulk density (heavy) can be measured using a method for the heavy bulk specific gravity (JIS R 9301-2-3, 1999).

In the component (2), the ratio (L. O. I, %) of the mass of the inorganic fine particles to the total sample mass of the adsorbed moisture, the interlayer moisture, the crystal moisture, the pyrolysate, and the combustion substance is not particularly limited, but may be 20% or less. Further, from the viewpoint of suppressing deterioration of the component (1), the ratio is preferably 0.1% or less, more preferably 0.08% or less, and still more preferably 0.05% or less.

In the component (2), L. O. I of the inorganic fine particles can be measured using a 1100±25° C. ignition loss method (JIS R 9301-3-2, 1999).

<<Component (3)>>

The component (3) is a solvent. The solvent is not particularly limited as long as the solvent is a medium in which the component (1) can be dispersed. Further, a solvent in which the component (1) is unlikely to be dissolved is preferable.

In the present specification, the "solvent" indicates a substance (excluding a polymerizable compound and a polymer) that enters a liquid state at 25° C. and 1 atm.

In the present specification, the term "dispersed" indicates a state in which the component (1) is floated or suspended in a solvent, a polymerizable compound, or a polymer or may be partially settled out.

Examples of the solvent include an ester such as methyl formate, ethyl formate, propyl formate, pentyl formate, methyl acetate, ethyl acetate, or pentyl acetate; a ketone such as γ-butyrolactone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an alcohol such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, or 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N-methyl-2-pyrrolidone, N,N-dimethylformamide, acetamide, or N,N-dimethylacetamide; an organic solvent containing a nitrile group such as acetonitrile, isobutyronitrile, propionitrile, or methoxy acetonitrile; an organic solvent containing a carbonate group such as ethylene carbonate or propylene carbonate; an organic solvent containing a halogenated hydrocarbon group such as methylene chloride or chloroform; an organic solvent containing a hydrocarbon group such as n-pentane, cyclohexane, n-hexane, benzene, toluene, or xylene; dimethyl sulfoxide, and 1-octadecene.

Among these, an ester such as methyl formate, ethyl formate, propyl formate, pentyl formate, methyl acetate, ethyl acetate, or pentyl acetate; a ketone such as γ-butyrolactone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an organic solvent containing a nitrile group such as acetonitrile, isobutyronitrile, propionitrile, or methoxyacetonitrile; an organic solvent containing a carbonate group such as ethylene carbonate or propylene carbonate; an organic solvent containing a halogenated hydrocarbon group such as methylene chloride or chloroform; or an organic solvent containing a hydrocarbon group such as n-pentane, cyclohexane, n-hexane, benzene, toluene, or xylene is preferable from the viewpoint that the polarity is low and the component (1) is unlikely to be dissolved therein, and an organic solvent containing a halogenated hydrocarbon group such as methylene chloride or chloroform; or an organic solvent containing a hydrocarbon group such as n-pentane, cyclohexane, n-hexane, benzene, toluene, or xylene is more preferable.

<<Component (4)>>

The component (4) is a polymerizable compound or a polymer.

The polymerizable compound contained in the composition according to the present embodiment is not particularly limited as long as the effects of the present invention are exhibited, and one or two or more kinds thereof may be used. As the polymerizable compound, a polymerizable compound with a low solubility of the component (1) at the temperature at which the composition according to the present embodiment is produced is preferable.

In the present specification, the "polymerizable compound" indicates a compound of a monomer containing a polymerizable group.

For example, in a case where the composition is produced at room temperature under normal pressure, the polymerizable compound is not particularly limited, and examples thereof include known polymerizable compounds such as styrene, acrylic acid ester, methacrylic acid ester, and acrylonitrile. Among these, any one or both of acrylic acid ester and methacrylic acid ester serving as monomer components of an acrylic resin are preferable as the polymerizable compounds.

The polymer contained in the composition according to the present embodiment is not particularly limited, and one or two or more kinds thereof may be used. As the polymer, a polymer with a low solubility of the component (1) at the temperature at which the composition according to the present embodiment is produced is preferable.

For example, in a case where the composition is produced at room temperature under normal pressure, the polymer is not particularly limited, and examples thereof include known polymers such as polystyrene, an acrylic resin, and an epoxy resin. Among these, an acrylic resin is preferable as the polymer. The acrylic resin has a constituent unit derived from any one or both of acrylic acid ester and methacrylic acid ester.

In the composition according to the present embodiment, the amount of any one or both of the acrylic acid ester and methacrylic acid ester and the constituent unit derived from these, on a mole percent basis, may be 10% by mole or greater, 30% by mole or greater, 50% by mole or greater, 80% by mole or greater, or 100% by mole with respect to the amount of all constituent units contained in the polymerizable compound or polymer as the component (4).

The weight-average molecular weight of the polymer is preferably in a range of 100 to 1200000, more preferably in a range of 1000 to 800000, and still more preferably in a range of 5000 to 150000.

In the present specification, the "weight-average molecular weight" indicates a value in terms of polystyrene to be measured according to a gel permeation chromatography (GPC) method.

<<Component (5)>>

The component (5) is at least one compound or ion (5) selected from the group consisting of ammonia, amine, carboxylic acid, and salts or ions thereof Along with the ammonia, the amine, and the carboxylic acid, examples of the compound which can be employed as the component (5) include at least one compound or ion selected from the group consisting of salts and ions thereof.

That is, examples of the component (5) include at least one compound or ion selected from the group consisting of ammonia, an amine, a carboxylic acid, a salt of the ammonia, a salt of the amine, a salt of the carboxylic acid, an ion of the ammonia, an ion of the amine, and an ion of the carboxylic acid.

The ammonia, the amine, the carboxylic acid, and the salts and the ions thereof typically function as capping ligands. The capping ligand is a compound having a function of being adsorbed on the surface of the component (1) and stably dispersing the component (1) in the composition. Examples of the ions or salts (such as an ammonium salt) of the ammonia or amine include an ammonium cation represented by Formula (A1) and an ammonium salt containing the ammonium cation. Examples of the ions or salts (such as a carboxylate) of the carboxylic acid include a carboxylate anion represented by Formula (A2) and a carboxylate containing the carboxylate anion. The composition according to the present embodiment may contain any one or both of an ammonium salt and a carboxylate.

The component (5) may be an ammonium cation represented by Formula (A1), or an amine obtained by removing any one of groups as $R^1$ to $R^4$ from the ammonium cation represented by Formula (A1) or an ammonium salt containing the amine.

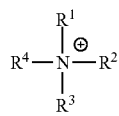

(A1)

In Formula (A1), $R^1$ to $R^3$ represent a hydrogen atom, and $R^4$ represents a hydrogen atom or a monovalent hydrocarbon group. The hydrocarbon group represented by $R^4$ may be a saturated hydrocarbon group (that is, an alkyl group or a cycloalkyl group) or an unsaturated hydrocarbon group.

The alkyl group represented by $R^4$ may be linear or branched.

The number of carbon atoms of the alkyl group represented by $R^4$ is typically in a range of 1 to 20, preferably in a range of 5 to 20, and more preferably in a range of 8 to 20.

The cycloalkyl group represented by $R^4$ may contain an alkyl group as a substituent. The number of carbon atoms in the cycloalkyl group is typically in a range of 3 to 30, preferably in a range of 3 to 20, and more preferably in a range of 3 to 11. The number of carbon atoms include the number of carbon atoms in a substituent.

The unsaturated hydrocarbon group as $R^4$ may be linear or branched.

The number of carbon atoms in the unsaturated hydrocarbon group as $R^4$ is typically in a range of 2 to 20, preferably in a range of 5 to 20, and more preferably in a range of 8 to 20.

It is preferable that $R^4$ represents a hydrogen atom, an alkyl group, or an unsaturated hydrocarbon group. As the unsaturated hydrocarbon group, an alkenyl group is preferable. It is preferable that $R^4$ represents an alkenyl group having 8 to 20 carbon atoms.

Specific examples of the alkyl group as $R^4$ include those provided as exemplary examples of the alkyl group represented by $R^6$ to $R^9$.

Specific examples of the cycloalkyl group as $R^4$ include those provided as exemplary examples of the cycloalkyl group represented by $R^6$ to $R^9$.

As the alkenyl group represented by $R^4$, a group in which any one single bond (C—C) between carbon atoms is substituted with a double bond (C=C) in the linear or branched alkyl group as $R^6$ to $R^9$ is an exemplary example, and the position of the double bond is not limited.

Preferred examples of such an alkenyl group include an ethenyl group, a propenyl group, a 3-butenyl group, a 2-butenyl group, a 2-pentenyl group, a 2-hexenyl group, a 2-nonenyl group, a 2-dodecenyl group, and a 9-octadecenyl group.

In a case of the ammonium cation forms a salt, the counter anion is not particularly limited, and preferred examples thereof include halide ions such as Br$^-$, Cl$^-$, I$^-$, and F$^-$; and carboxylate ions.

Preferred examples of the ammonium cation represented by Formula (A1) and the ammonium salt containing a counter anion include an n-octylammonium salt and an oleyl ammonium salt.

The component (5) may be a carboxylate anion represented by Formula (A2), carboxylic acid in which a proton is bonded to a carboxylate anion represented by Formula (A2), or a carboxylate containing the carboxylate anion.

$R^5$—$CO_2^-$ (A2)

In Formula (A2), $R^5$ represents a monovalent hydrocarbon group. The hydrocarbon group represented by $R^5$ may be a saturated hydrocarbon group (that is, an alkyl group or a cycloalkyl group) or an unsaturated hydrocarbon group.

The alkyl group represented by $R^5$ may be linear or branched. The number of carbon atoms of the alkyl group represented by $R^5$ is typically in a range of 1 to 20, preferably in a range of 5 to 20, and more preferably in a range of 8 to 20.

The cycloalkyl group represented by $R^5$ may contain an alkyl group as a substituent. The number of carbon atoms in the cycloalkyl group is typically in a range of 3 to 30, preferably in a range of 3 to 20, and more preferably in a range of 3 to 11. The number of carbon atoms include the number of carbon atoms in a substituent.

The unsaturated hydrocarbon group as $R^5$ may be linear or branched.

The number of carbon atoms in the unsaturated hydrocarbon group as $R^5$ is typically in a range of 2 to 20, preferably in a range of 5 to 20, and more preferably in a range of 8 to 20.

It is preferable that $R^5$ represents an alkyl group or an unsaturated hydrocarbon group. As the unsaturated hydrocarbon group, an alkenyl group is preferable.

Specific examples of the alkyl group as $R^5$ include those provided as exemplary examples of the alkyl group represented by $R^6$ to $R^9$.

Specific examples of the cycloalkyl group as $R^5$ include those provided as exemplary examples of the cycloalkyl group represented by $R^6$ to $R^9$.

Specific examples of the alkenyl group as $R^5$ include those provided as exemplary examples of the alkenyl group represented by $R^4$.

Among these, a 9-octadecenyl group is preferable as the alkenyl group represented by $R^5$.

As the carboxylate anion represented by Formula (A2), an oleate anion is preferable.

In a case where the carboxylate anion forms a salt, the counter cation is not particularly limited, and preferred examples thereof include an alkali metal ion, an alkaline earth metal cation, and an ammonium cation.

<<Component (6)>>

The component (6) is a silazane or modified product thereof.

From the viewpoint of improving the quantum yield and the absorption rate, it is preferable that the composition according to the present invention contains a silazane or modified product thereof.

A silazane is a compound having a Si—N—Si bond.

The silazane may be linear, branched, or cyclic. Further, the silazane may be low molecular or high molecular (in the present specification, also referred to as a polysilazane).

The "low-molecular-weight" in the present specification indicates that the number average molecular weight is less than 600, and the "high-molecular-weight" indicates that the number average molecular weight is in a range of 600 to 2000.

In the present specification, the "number average molecular weight" indicates a value in terms of polystyrene to be measured according to a gel permeation chromatography (GPC) method.

For example, a low-molecular-weight silazane represented by Formula (B1) or (B2) or a polysilazane which has a constituent unit represented by Formula (B3) or has a structure represented by Formula (B4) is preferable.

The silazane may be used by performing silica modification according to the following method.

The silazane contained in the composition according to the embodiment may be a modified product of a silazane which has been modified according to the following method.

The modification indicates that a Si—O—Si bond is formed by substituting N with O in at least some Si—N—Si bonds contained in the silazane, and the modified product of the silazane indicates a compound having a Si—O—Si bond.

As the modified product of the silazane, a low-molecular-weight compound in which at least one N in Formula (B1) or (B2) is substituted with O, a high-molecular-weight compound in which at least one N in a polysilazane having a constituent unit represented by Formula (B3) is substituted with O, or a high-molecular-weight compound in which at least one N in a polysilazane having a structure represented by Formula (B4) is substituted with O is preferable.

The ratio of the number of substituted Os is preferably in a range of 0.1% to 100%, more preferably in a range of 10% to 98%, and still more preferably in a range of 30% to 95% with respect to the total amount of N in Formula (B2).

The ratio of the number of substituted Os is preferably in a range of 0.1% to 100%, more preferably in a range of 10% to 98%, and still more preferably in a range of 30% to 95% with respect to the total amount of N in Formula (B3).

The ratio of the number of substituted Os is preferably in a range of 0.1% to 99%, more preferably in a range of 10% to 97%, and still more preferably in a range of 30% to 95% with respect to the total amount of N in Formula (B4).

The modified product of a silazane may be used alone or in the form of a mixture of two or more kinds thereof.

The number of Si atoms, the number of N atoms, and the number of O atoms contained in the silazane or modified product thereof can be calculated according to nuclear magnetic resonance spectroscopy (NMR), X-ray photoelectron spectroscopy (XPS), or energy dispersive X-ray analysis (EDX) using a transmission electron microscope (TEM).

According to a particularly preferable method, the calculation can be made by measuring the number of Si atoms, the number of N atoms, and the number of O atoms in the composition according to the X-ray photoelectron spectroscopy (XPS).

The ratio of the number of O atoms to the number of N atoms contained in the silazane and modified product thereof to be measured according to the above-described method is preferably in a range of 0.1% to 99%, more preferably in a range of 10% to 95%, and still more preferably 30% to 90%.

At least part of the silazane or modified product thereof may be adsorbed by the perovskite compound contained in the composition or may be dispersed in the composition.

(B1)

In Formula (B1), $R^{14}$ and a plurality of $R^{15}$'s each independently represent a hydrogen atom, an alkyl group having 1 to 20 carbon atoms, an alkenyl group having 1 to 20 carbon atoms, a cycloalkyl group having 3 to 20 carbon atoms, an aryl group having 6 to 20 carbon atoms, or an alkylsilyl group having 1 to 20 carbon atoms. The alkyl group having 1 to 20 carbon atoms, the alkenyl group having 1 to 20 carbon atoms, the cycloalkyl group having 3 to 20 carbon atoms, the aryl group having 6 to 20 carbon atoms, or the alkylsilyl group having 1 to 20 carbon atoms may have a substituent such as an amino group. A plurality of $R^{15}$'s may be the same as or different from one another.

Examples of the low-molecular-weight silazane represented by Formula (B1) include 1,3-divinyl-1,1,3,3-tetramethyldisilazane, 1,3-diphenyltetramethyldisilazane, and 1,1,1,3,3,3-hexamethyldisilazane.

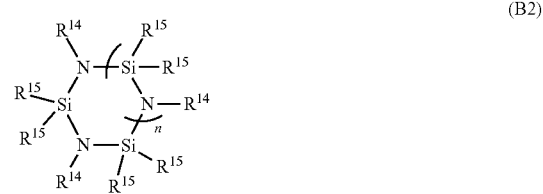

(B2)

In Formula (B2), $R^{14}$ and $R^{15}$ each have the same definition as described above.

A plurality of $R^{14}$'s may be the same as or different from one another.

A plurality of $R^{15}$'s may be the same as or different from one another.

n represents an integer of 1 to 20. n may represent an integer of 1 to 10 or 1 or 2.

Examples of the low-molecular-weight silazane represented by Formula (B2) include octamethylcyclotetrasilazane, 2,2,4,4,6,6,-hexamethylcyclotrisilazane, and 2,4,6-trimethyl-2,4,6-trivinylcyclotrisilazane.

As the low-molecular-weight silazane, octamethylcyclotetrasilazane or 1,3-diphenyltetramethyldisilazane is preferable, and octamethylcyclotetrasilazane is more preferable.

The polysilazane is a polymer compound having a Si—N—Si bond and is not particularly limited, and examples thereof include a polymer compound having a constituent unit represented by Formula (B3). The constituent unit represented by Formula (B3) which is contained in the polysilazane may be used alone or in combination of a plurality of kinds thereof.

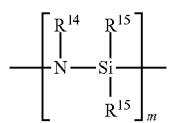

(B3)

In Formula (B3), $R^{14}$ and $R^{15}$ each have the same definition as described above.

A plurality of $R^{14}$'s may be the same as or different from one another.

A plurality of $R^{15}$'s may be the same as or different from one another.

m represents an integer of 2 to 10000.

The polysilazane having a constituent unit represented by Formula (B3) may be a perhydropolysilazane in which all of $R^{14}$'s and $R^{15}$'s represent a hydrogen atom.

The polysilazane having a constituent unit represented by Formula (B3) may be an organopolysilazane in which at least one $R^{15}$ represents a group other than the hydrogen atom. According to the application thereof, the perhydropolysilazane or organopolysilazane may be appropriately selected or can be used by being mixed.

The polysilazane may have a ring structure in a portion of a molecule. For example, the polysilazane may have a structure represented by Formula (B4).

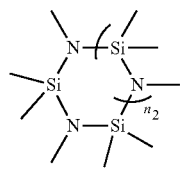

(B4)

$n_2$ represents an integer of 1 to 10000. $n_2$ may represent an integer of 1 to 10 or 1 or 2.

The silazane or modified product thereof is not particularly limited. However, from the viewpoint of improving the dispersibility and suppressing aggregation, an organopolysilazane or modified product thereof is preferable. The organopolysilazane may be an organopolysilazane in which at least one of $R^{14}$ and $R^{15}$ in Formula (B3) represents an alkyl group having 1 to 20 carbon atoms, an alkenyl group having 1 to 20 carbon atoms, a cycloalkyl group having 3 to 20 carbon atoms, an aryl group having 6 to 20 carbon atoms, or an alkylsilyl group having 1 to 20 carbon atoms and which has a constituent unit represented by Formula (B3), or an organopolysilazane in which at least one bonding site in Formula (B4) is bonded to $R^{14}$ or $R^{15}$ and at least one of $R^{14}$ and $R^{15}$ represents an alkyl group having 1 to 20 carbon atoms, an alkenyl group having 1 to 20 carbon atoms, a cycloalkyl group having 3 to 20 carbon atoms, an aryl group having 6 to 20 carbon atoms, or an alkylsilyl group having 1 to 20 carbon atoms and which has a structure represented by Formula (B4).

It is preferable that the organopolysilazane is an organopolysilazane in which at least one of $R^{14}$ and $R^{15}$ in Formula (B3) represents a methyl group and has a constituent unit represented by Formula (B3), or a polysilazane in which at least one bonding site in Formula (B4) is bonded to $R^{14}$ or $R^{15}$ and at least one of $R^{14}$ and $R^{15}$ represents a methyl group and which has a structure represented by Formula (B4).

A typical polysilazane is a structure in which a linear structure and a ring structure such as a 6-membered ring or an 8-membered ring are present. The molecular weight thereof is in a range of 600 to 2000 (in terms of polystyrene) as the number average molecular weight (Mn), and the silazane may be a substance in a liquid or solid state depending on the molecular weight thereof. As the polysilazane, a commercially available product may be used, and examples of the commercially available product include NN120-10, NN120-20, NAX120-20, NN110, NAX120, NAX110, NL120A, NL110A, NL150A, NP110, and NP140 (all manufactured by AZ Electronic Materials plc), AZNN-120-20, Durazane (registered trademark) 1500 Slow Cure, Durazane (registered trademark) 1500 Rapid Cure, and Durazane (registered trademark) 1800 (all manufactured by Merck Performance Materials Ltd.), and Durazane (registered trademark) 1033 (manufactured by Merck Performance Materials Ltd.).

As the polysilazane having a constituent unit represented by Formula (B3), AZNN-120-20, Durazane (registered trademark) 1500 Slow Cure or Durazane (registered trademark) 1500 Rapid cure is preferable, and Durazane (registered trademark) 1500 Slow Cure is more preferable.

<Regarding Compounding Ratio of Each Component>

The compounding ratio between the component (1) and the component (2) in the composition according to the present embodiment may be at the level where a sufficient light absorption amount and a sufficient quantum yield are obtained and can be appropriately determined depending on the kind and the like of the component (1) and the component (2).

In the composition according to the present embodiment, the weight ratio [(1)/(2)] between the component (1) and the component (2) may be in a range of 0.001 to 10, in a range of 0.005 to 1, or in a range of 0.01 to 0.1.

The composition in which the compounding ratio between the mass of the component (1) and the mass of the component (2) is in the above-described range is preferable from the viewpoint of obtaining a sufficient light absorption amount and a sufficient quantum yield.

The compounding ratio between the mass of the component (1) and the total mass of the component (3) and the component (4) in the composition according to the present embodiment may be at the level where the effect of light emission due to the component (1) is satisfactorily exhibited and can be appropriately determined depending on the kind and the like of the component (1), the component (2), the component (3), and the component (4).

In the composition according to the embodiment which contains the component (1), the component (2), and at least one selected from the group consisting of the component (3) and the component (4), the mass ratio [(1)/(total of (3) and (4))] of the mass of the component (1) to the total mass of the component (3) and the component (4) may be in a range of 0.00001 to 10, in a range of 0.0001 to 2, or in a range of 0.0005 to 1.

From the viewpoint of making the component (1) difficult to aggregate and satisfactorily exhibiting the light-emitting property, the composition in which the compounding ratio between the mass of the component (1) and the total mass of the component (3) and the component (4) is in the above-described range is preferable.

The compounding ratio between the component (1) and the component (5) in the composition according to the present embodiment may be at the level where the effect of light emission due to the component (1) is satisfactorily exhibited and can be appropriately determined depending on the kind and the like of the component (1), the component (2), the component (3), the component (4), and the component (5).

In the composition according to the embodiment which contains the component (1), the component (2), the component (5), and at least one selected from the group consisting of the component (3) and the component (4) and in the composition according to the embodiment which contains the component (1), the component (2), the component (4'), and the component (5) and in which the total content ratio of the component (1), the component (2), and the component (4') is 90% by mass or greater with respect to the total mass of the composition, the molar ratio [(1)/(5)] of the component (1) to the component (5) may be in a range of 0.0001 to 1000 or in a range of 0.01 to 100.

From the viewpoint of making the component (1) difficult to aggregate and satisfactorily exhibiting the light-emitting property, a composition in which the compounding ratio between the component (1) and the component (5) is in the above-described range is preferable.

The compounding ratio between the component (1) and the component (6) in the composition according to the present embodiment may be at the level where the effect of light emission due to the component (1) is satisfactorily exhibited and can be appropriately determined depending on the kind and the like of the component (1), the component (2), the component (3), the component (4), the component (5), and the component (6).

In the composition according to the embodiment which contains the component (1), the component (2), the component (5), the component (6), and at least one selected from the group consisting of the component (3) and the component (4) and in the composition according to the embodiment which contains the component (1), the component (2), the component (4'), the component (5), and the component (6) and in which the total content ratio of the component (1), the component (2), and the component (4') is 90% by mass or greater with respect to the total mass of the composition, the molar ratio [Si/B] between the metal ion serving as a constituent component B of the component (1) and the Si element of the component (6) may be in a range of 0.001 to 2000 or in a range of 0.01 to 500.

From the viewpoint of making the component (1) difficult to aggregate and satisfactorily exhibiting the light-emitting property, a composition in which the compounding ratio between the component (1) and the component (6) is in the above-described range is preferable.

<<Method for Producing Component (1)>>

The perovskite compound containing constituent components A, B, and X can be produced according to a method of a first embodiment or a second embodiment described below with reference to the known literature (Nano Lett. 2015, 15, 3692 to 3696, ACSNano, 2015, 9, 4533 to 4542).

(First Embodiment of Method for Producing Perovskite Compound Containing Constituent Components a, B, and X)

Examples of the method for producing the perovskite compound according to the present invention include a production method including a step of dissolving the constituent component B, the constituent component X, and the constituent component A in a solvent x to obtain a solution g; and a step of mixing the obtained solution g with a solvent y in which the solubility of the perovskite compound therein is lower than that of the solvent x used in the step of obtaining the solution g. More specific examples thereof include a production method including a step of dissolving a compound that contains the constituent component B and the constituent component X and a compound that contains the constituent component A, or the constituent component A and the constituent component X in a solvent x to obtain a solution g; and a step of mixing the obtained solution g with a solvent y in which the solubility of the perovskite compound therein is lower than that of the solvent x used in the step of obtaining the solution g.

The perovskite compound is precipitated by mixing the obtained solution g with the solvent y in which the solubility of the perovskite compound therein is lower than that of the solvent x used in the step of obtaining the solution g.

Hereinafter, the production method including a step of dissolving a compound that contains the constituent component B and the constituent component X and a compound that contains the constituent component A, or the constituent component A and the constituent component X in a solvent x to obtain a solution g; and a step of mixing the obtained solution g with a solvent y in which the solubility of the perovskite compound therein is lower than that of the solvent x used in the step of obtaining the solution g will be described.

Further, the solubility indicates the solubility at the temperature of carrying out the mixing step.

From the viewpoint of stably dispersing the perovskite compound, it is preferable that the production method includes a step of adding capping ligands. It is preferable that the capping ligands are added before the mixing step is carried out. The capping ligands may be added to the solution g in which the constituent component A, the constituent component B, and the constituent component X are dissolved; the solvent y in which the solubility of the perovskite compound therein is lower than that of the solvent x used in the step of obtaining the solution g; or both of solvent x and the solvent y.

It is preferable that the production method includes a step of removing coarse particles using a method for carrying out centrifugation or filtration after the mixing step described above. The size of the coarse particles to be removed by the removal step is preferably 10 μm or greater, more preferably 1 μm or greater, and particularly preferably 500 nm or greater.

The step of mixing the solution g with the solvent y described above may be a step (I) of adding the solution g dropwise to the solvent y or a step (II) of adding the solvent y dropwise to the solution g.

However, from the viewpoint of improving the dispersibility of the component (1), the step (I) is preferable.

It is preferable that stirring is performed during dropwise addition from the viewpoint of improving the dispersibility of the component (1). In the step of mixing the solution g with the solvent y, the temperature is not particularly limited, but is preferably in a range of −20° C. to 40° C. and more preferably in a range of −5° C. to 30° C. from the viewpoint of ensuring easy precipitation of the component (1).

Two kinds of solvents x and y with different solubilities in the solvent of the perovskite compound used in the production method are not particularly limited, and examples thereof include two solvents selected from the group consisting of alcohols such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, and 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N-methyl-2-pyrrolidone, N,N-dimethylformamide, acetamide, or N,N-dimethylacetamide; an ester such as methyl formate, ethyl formate, propyl formate, pentyl formate, methyl acetate, ethyl acetate, or pentyl acetate; a ketone such as γ-butyrolactone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an organic solvent containing a nitrile group such as acetonitrile, isobutyronitrile, propionitrile, or methoxy acetonitrile; an organic solvent containing a carbonate group such as ethylene carbonate or propylene carbonate; an organic solvent containing a halogenated hydrocarbon group such as methylene chloride or chloroform; an organic solvent containing a hydrocarbon group such as n-pentane, cyclohexane, n-hexane, benzene, toluene, or xylene; and dimethyl sulfoxide.

As the solvent x used in the step of obtaining the solution g which is included in the production method, a solvent with a higher solubility in the solvent of the perovskite compound is preferable, and examples thereof include, in a case where the step is performed at room temperature (10° C. to 30° C.), alcohols such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, and 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N-methyl-2-pyrrolidone, N,N-dimethylformamide, acetamide, or N,N-dimethylacetamide; and dimethyl sulfoxide.

As the solvent y used in the mixing step which is included in the production method, a solvent with a lower solubility in the solvent of the perovskite compound is preferable, and examples thereof include, in a case where the step is performed at room temperature (10° C. to 30° C.), an ester such as methyl formate, ethyl formate, propyl formate, pentyl formate, methyl acetate, ethyl acetate, or pentyl acetate; a ketone such as γ-butyrolactone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an organic solvent containing a nitrile group such as acetonitrile, isobutyronitrile, propionitrile, or methoxy acetonitrile; an organic solvent containing a carbonate group such as ethylene carbonate or propylene carbonate; an organic solvent containing a halogenated hydrocarbon group such as methylene chloride or chloroform; and an organic solvent containing a hydrocarbon group such as n-pentane, cyclohexane, n-hexane, benzene, toluene, or xylene.

A difference in solubility between two kinds of solvents with different solubilities is preferably in a range of (100 μg/100 g of solvent) to (90 g/100 g of solvent) and more preferably in a range of (1 mg/100 g of solvent) to (90 g/100 g of solvent). From the viewpoint of adjusting the difference in solubility to be in a range of (100 μg/100 g of solvent) to (90 g/100 g of solvent), for example, in a case where the mixing step is performed at room temperature (10° C. to 30° C.), it is preferable that the solvent x used in the step of obtaining the solution is an organic solvent containing an amide group such as N,N-dimethylacetamide or dimethyl sulfoxide, and the solvent y used in the mixing step is an organic solvent containing a halogenated hydrocarbon group such as methylene chloride or chloroform or an organic solvent containing a hydrocarbon group such as n-pentane, cyclohexane, n-hexane, benzene, toluene, or xylene.

As a method for extracting the perovskite compound from the obtained dispersion liquid containing the perovskite compound, a method for recovering only the perovskite compound by performing solid-liquid separation is an exemplary example.

Examples of the above-described solid-liquid separation method include a method for performing filtration or the like and a method of using evaporation of a solvent.

(Second Embodiment of Method for Producing Perovskite Compound Containing Constituent Components A, B, and X)

The method for producing the perovskite compound may be a production method including a step of adding the constituent component B, the constituent component X, and the constituent component A to a solvent z at a high temperature and dissolving the components therein to obtain a solution h; and a step of cooling the obtained solution h. More specifically, a production method including a step of adding a compound containing the constituent component B and the constituent component X, a compound containing the constituent component A, or the constituent component A and the constituent component X to a solvent z at a high temperature and dissolving the components therein to obtain a solution h; and a step of cooling the obtained solution h is an exemplary example.

The step of adding a compound containing the constituent component B and the constituent component X and a compound containing the constituent component A, or the constituent component A and the constituent component X to a solvent z at a high temperature and dissolving the components therein to obtain a solution h may be a step of adding a compound containing the constituent component B and the constituent component X and a compound containing the constituent component A, or the constituent component A and the constituent component X to a solvent z and increasing the temperature to obtain a solution h.

According to the production method, the perovskite compound according to the present invention can be produced by allowing the perovskite compound according to the present invention to precipitate based on the difference in solubility caused by the difference in temperature.

From the viewpoint of stably dispersing the perovskite compound, it is preferable that the production method includes a step of adding capping ligands. It is preferable that the capping ligands are contained in the solution h before the cooling step.

It is preferable that the production method includes a step of removing coarse particles using a method for carrying out centrifugation or filtration after the cooling step. The size of the coarse particles to be removed by the removal step is preferably 10 μm or greater, more preferably 1 μm or greater, and particularly preferably 500 nm or greater.

Here, the solvent z at a high temperature may be a solvent at a temperature at which the compound containing the constituent component B and the constituent component X and the compound containing the constituent component A or the constituent component A and the constituent component X are dissolved. For example, a solvent at 60° C. to 600° C. is preferable, and a solvent at 80° C. to 400° C. is more preferable.

The cooling temperature is preferably in a range of −20° C. to 50° C. and more preferably in a range of −10° C. to 30° C.

The cooling rate is preferably in a range of 0.1° C. to 1500° C./min and more preferably in a range of 10° C. to 150° C./min.

The solvent z used in the production method is not particularly limited as long as the compound containing the constituent component B and the constituent component X and the compound containing the constituent component A or the constituent component A and the constituent component X are dissolved in the solvent. For example, the solvent described as the component (3) can be used.

As a method for extracting the perovskite compound from the obtained dispersion liquid containing the perovskite compound, a method for recovering only the perovskite compound by performing solid-liquid separation is an exemplary example.

Examples of the above-described solid-liquid separation method include a method for performing filtration or the like and a method of using evaporation of a solvent.

[Method for Modifying Silazane]

Examples of the method for modifying the silazane include known modification methods such as a method for performing modification by irradiation with vacuum ultraviolet rays using an excimer lamp or the like and a method for performing a humidification treatment using water or the like. Among these, the modification treatment through the humidification treatment is preferable from the viewpoint of forming a stronger protective layer.

The wavelength of ultraviolet rays used in the method for radiating ultraviolet rays is typically in a range of 10 to 400 nm, preferably in a range of 10 to 350 nm, and more preferably in a range of 100 nm to 180 nm. Examples of the light source that generates ultraviolet rays include a metal halide lamp, a high pressure mercury lamp, a low pressure mercury lamp, a xenon arc lamp, a carbon arc lamp, an excimer lamp, and UV laser light.

As the method for performing the humidification treatment, a method for reacting water vapor with a silazane may be used.

In a case where the component (2) or the silazane in the composition is modified by performing the humidification treatment, for example, the composition may be allowed to stand or be stirred for a certain time under the conditions of a temperature and a humidity described below.

From the viewpoint of improving the dispersibility of the silazane contained in the composition, it is preferable that stirring is carried out.

The temperature during the humidification treatment may be a temperature at which the modification sufficiently proceeds and is preferably in a range of 5° C. to 150° C., more preferably in a range of 10° C. to 100° C., and still more preferably in a range of 15° C. to 80° C.

The humidity during the humidification treatment may be a humidity at which the moisture is sufficiently supplied to the compound containing the silazane in the composition and is in a range of 30% to 100%, preferably in a range of 40% to 95%, and more preferably in a range of 60% to 90%.

In the present specification, the "humidity" indicates the relative humidity at a temperature at which the humidification treatment is performed.

The time required for the humidification treatment may be a time at which the modification sufficiently proceeds and is in a range of 10 minutes to 1 week, preferably in a range of 1 hour to 5 days, and more preferably in a range of 12 hours to 3 days.

<Method for Producing Composition>

Hereinafter, a method for producing the composition of the present invention will be described based on the embodiments. According to the method for producing the composition according to the present embodiment, the composition according to the present invention can be produced. Further, the composition of the present invention is not limited to a composition produced by a method for producing a composition according to the embodiment described below.

[Method for Producing Composition Containing Component (1), Component (2), and the Component (3)]

The method for producing the composition containing the component (1), the component (2), and the component (3) may be the following production method (a1) or the following production method (a2).

The production method (a1) is a method for producing the composition, including a step of mixing the component (1) with the component (3) and a step of mixing the mixture that contains the component (1) and the component (3) with the component (2).

The production method (a2) is a method for producing the composition, including a step of mixing the component (1) with the component (2) and a step of mixing the mixture that contains the component (1) and the component (2) with the component (3).

According to the production method (a1), it is preferable that the component (1) is dispersed in the component (3). The production method (a1) may be a method for producing the composition, including a step of dispersing the component (1) in the component (3) to obtain a dispersion liquid and a step of mixing the dispersion liquid with the component (2).

From the viewpoint of improving the dispersibility, it is preferable that stirring is performed in the mixing step included in the above-described production method.

The temperature in the mixing step included in the above-described production method is not particularly limited, but is preferably in a range of 0° C. to 100° C. and more preferably in a range of 10° C. to 80° C. from the viewpoint of uniformly mixing the mixture.

From the viewpoint of improving the dispersibility of the component (1), the production method (a1) is preferable as the method for producing the composition.

In the present embodiment, the component (2) and the component (3) may be mixed in any step included in the method for producing the component (1) described above. For example, the method for producing the composition may be the following production method (a3) or the following production method (a4).

The production method (a3) is a production method including a step of dissolving a compound containing the constituent component B and the constituent component X, a compound containing the constituent component A, or the constituent component A and the constituent component X, and the component (2) in a solvent x (the component (3)) to obtain a solution g; and a step of mixing the obtained solution g with a solvent y (component (3)) in which the solubility of the perovskite compound therein is lower than that of the solvent x used in the step of obtaining the solution g.

The production method (a4) is a production method including a step of mixing a compound containing the constituent component B and the constituent component X, a compound containing the constituent component A, or the constituent component A and the constituent component X, and the component (2) with the component (3) at a high temperature and dissolving the component (1) and the component (2) in the component (3) to obtain a solution h; and a step of cooling the obtained solution h, The conditions for each step included in these production methods are the same as those described in the first embodiment and the second embodiment according to the method for producing the perovskite compound described above.

[Method for Producing Composition Containing Component (1), Component (2), Component (3), and Component (5)]

For example, the method for producing a composition containing the component (1), the component (2), the component (3), and the component (5) can be carried out in the same manner as in the method for producing a composition containing the component (1), the component (2), and the component (3) except that the component (5) is mixed in any step included in the production methods (a1) to (a4) described above.

In the present embodiment, from the viewpoint of improving the dispersibility of the component (1), it is preferable that the component (5) is mixed in any step included in the method for producing the perovskite compound which is the above-described component (1) containing constituent components A, B, and X. For example, it is preferable that the composition is produced using the following production method (b1) or the following production method (b2).

The production method (b1) is a production method including a step of dissolving a compound that contains the constituent component B and the constituent component X, a compound that contains the constituent component A, or the constituent component A and the constituent component X, the component (2), and the component (5) in a solvent x (the component (3)) to obtain a solution g; and a step of mixing the obtained solution g with a solvent y (the component (3)) in which the solubility of the perovskite compound therein is lower than that of the solvent x component used in the step of obtaining the solution g.

The production method (b2) is a production method including a step of mixing a compound that contains the constituent component B and the constituent component X, a compound that contains the constituent component A, or the constituent component A and the constituent component X, the component (2), and the component (5) with the component (3) at a high temperature such that the component (1), the component (2), and the component (5) are dissolved in the component (3) to obtain a solution h; and a step of cooling the obtained solution h.

[Method for Producing Composition Containing Component (1), Component (2), and Component (4)]

Examples of the method for producing a composition containing the component (1), the component (2), and the component (4) include a method for mixing the component (1), the component (2), and the component (4).

From the viewpoint of improving the dispersibility of the component (1), it is preferable that the step of mixing the component (1), the component (2), and the component (4) is performed by stirring the mixture.

In the step of mixing the component (1), the component (2), and the component (4), the temperature is not particularly limited, but is preferably in a range of 0° C. to 100° C. and more preferably in a range of 10° C. to 80° C. from the viewpoint of uniformly mixing the mixture.

The method for producing the composition containing the component (1), the component (2), and the component (4) include the following production methods (c1), (c2), and (c3).

The production method (c1) is a production method including a step of dispersing the component (1) in the component (4) to obtain a dispersion; and a step of mixing the obtained dispersion with the component (2).

The production method (c2) is a production method including a step of dispersing the component (2) in the component (4) to obtain a dispersion; and a step of mixing the obtained dispersion with the component (1), The production method (c3) is a production method including a step of dispersing the mixture of the component (1) and the component (2) in the component (4).

Among the production methods (c1) to (c3), the production method (c1) is preferable from the viewpoint of improving the dispersibility of the component (1). According to the method described above, the composition of the present invention can be obtained as a mixture of the dispersion in which the component (1) is dispersed in the component (4) with the component (2).

In the steps of obtaining each dispersion included in the production methods (c1) to (c3), the component (4) may be added dropwise to the component (1) and/or the component (2), or any one or both of the component (1) and the component (2) may be added dropwise to the component (4).

From the viewpoint of improving the dispersibility, it is preferable that any one or both of the component (1) or the component (2) is added dropwise to the component (4).

In each mixing step included in the production methods (c1) and (c2), the component (1) or the component (2) may be added dropwise to the dispersion, or the dispersion may be added dropwise to the component (1) or the component (2).

From the viewpoint of improving the dispersibility, it is preferable that the component (1) or the component (2) is added dropwise to the dispersion.

In a case where a polymer is employed as the component (4), the polymer may be a polymer in a state of being dissolved in a solvent.

The solvent in which the above-described polymer is dissolved is not particularly limited as long the polymer (resin) can be dissolved in the solvent, but a solvent in which the component (1) used in the present invention is unlikely to be dissolved is preferable.

As the solvent in which the above-described polymer is dissolved, for example, the solvent described as the component (3) can be used.

Further, the method for producing the composition containing the component (1), the component (2), and the component (4) may be the following production method (c4).

The production method (c4) is a method for producing the composition, including a step of dispersing the component (1) in the component (3) to obtain a dispersion liquid; a step of mixing the dispersion liquid with the component (4) to obtain a mixed solution; and a step of mixing the mixed solution with the component (2).

[Method for Producing Composition Containing Component (1), Component (2), Component (4), and Component (5)]

The method for producing a composition containing the component (1), the component (2), the component (4), and the component (5) can be carried out in the same manner as in the method for producing a composition containing the component (1), the component (2), and the component (4) except that the component (5) is added.

The component (5) may be added in any steps included in the method for producing the perovskite compound which is the above-described component (1) containing the constituent components A, B, and X or may be added in any steps included in the method for producing the composition containing the component (1), the component (2), and the component (4).

From the viewpoint of improving the dispersibility of the component (1), it is preferable that the component (5) is added in any steps included in the method for producing the perovskite compound which is the above-described component (1) containing the constituent components A, B, and X.

In the method for producing the composition containing the component (1), the component (2), the component (4), and the component (5), the component (3) may be used.

For example, the composition according to the present embodiment which is obtained using the above-described production method may be a mixture of a dispersion obtained by dispersing the component (1) in which at least part thereof is coated with the component (5) in the component (3), a dispersion obtained by dispersing the component (2) in the component (3), and the component (4); a mixture of a dispersion obtained by dispersing the component (1) in which at least part thereof is coated with the component (5) in the component (3), a dispersion in which the component (2) and the component (4) are dispersed in the component (3); or a mixture of a dispersion obtained by dispersing the component (2) and the component (1) in which at least part thereof is coated with the component (5) in the component (3) with the component (4).

[Method for Producing Composition which Contains Component (1), Component (2), and Component (4') and in which Total Content Ratio of Component (1), Component (2), and Component (4') is 90% by Mass or Greater with Respect to Total Mass of Composition]

Examples of the method for producing the composition which contains the component (1), the component (2), and the component (4') and in which the total content ratio of the component (1), the component (2), and the component (4') is 90% by mass or greater with respect to the total mass of the composition include the following production method (d).

The production method (d) is a production method including a step of mixing the component (1), the component (2), and the polymerizable compound; and a step of polymerizing the polymerizable compound, or a production method including a step of mixing the component (1), the component (2) and the polymer dissolved in a solvent; and a step of removing the solvent.

As the mixing step included in the production method, the same mixing method as the method for producing the composition containing the component (1), the component (2), and the component (4) described above can be used.

Examples of the production method include the following production methods (d1) to (d6).

The production method (d1) is a production method including a step of dispersing the component (1) in the polymerizable compound to obtain a dispersion, a step of mixing the obtained dispersion with the component (2), and a step of polymerizing the polymerizable compound;

The production method (d2) is a production method including a step of dispersing the component (1) in the polymer dissolved in a solvent to obtain a dispersion, a step of mixing the obtained dispersion with the component (2), and a step of removing the solvent.

The production method (d3) is a production method including a step of dispersing the component (2) in the polymerizable compound to obtain a dispersion, a step of mixing the obtained dispersion with the component (1), and a step of polymerizing the polymerizable compound.

The production method (d4) is a production method including a step of dispersing the component (2) in the polymer dissolved in a solvent to obtain a dispersion, a step of mixing the obtained dispersion with the component (1), and a step of removing the solvent.

The production method (d5) is a production method including a step of dispersing the mixture of the component (1) and the component (2) in the polymerizable compound and a step of polymerizing the polymerizable compound.

The production method (d6) is a production method including a step of dispersing the mixture of the component (1) and the component (2) in the polymer dissolved in a solvent and a step of removing the solvent.

The step of removing the solvent included in the production method may be a step of allowing the solvent to stand at room temperature so as to be naturally dried or a step of evaporating the solvent by being heated or dried under reduced pressure using a vacuum dryer.

For example, the solvent can be removed by being dried in a temperature range of 0° C. to 300° C. for 1 minute to 7 days.

The step of polymerizing the polymerizable compound included in the production method can be performed by appropriately using a known polymerization reaction such as radical polymerization.

For example, in a case of the radical polymerization, the polymerization reaction can be allowed to proceed by adding a radical polymerization initiator to the mixture of the component (1), the component (2), and the polymerizable compound to generate a radical.

The radical polymerization initiator is not particularly limited, and examples thereof include a photoradical polymerization initiator.

As the photoradical polymerization initiator, bis(2,4,6-trimethylbenzoyl)-phenylphosphine oxide is exemplary example.

[Method for Producing Composition which Contains Component (1), Component (2), Component (4'), and Component (5) and in which Total Content Ratio of Component (1), Component (2), Component (4'), and Component (5) is 90% by Mass or Greater with Respect to Total Mass of Composition]

The method for producing the composition which contains the component (1), the component (2), the component (4'), and the component (5) and in which the total content ratio of the component (1), the component (2), the component (4'), and the component (5) is 90% by mass or greater with respect to the total mass of the composition may be the same as the above-described method for producing the composition which contains the component (1), the component (2), and the component (4') and in which the total content ratio of the component (1), the component (2), and the component (4') is 90% by mass or greater with respect to the total mass of the composition except that the component (5) is added in any steps included in the method for producing the composition which contains the component (1), the component (2), and the component (4') and in which the total content ratio of the component (1), the component (2), and the component (4') is 90% by mass or greater with respect to the total mass of the composition.

The component (5) may be added in any steps included in the method for producing the perovskite compound which is the above-described component (1) containing the constituent components A, B, and X, in the step of mixing the component (1), the component (2), and the polymerizable compound, or in the step of mixing the component (1), the component (2), and the polymer dissolved in a solvent. From the viewpoint of improving the dispersibility of the perovskite compound, it is preferable that the component (5) is added in any steps included in the method for producing the perovskite compound which is the component (1) containing the constituent components A, B, and X.

[Method for Producing Composition which Further Contains Component (6)]

The production method can be carried out in the same manner as in the method for producing the composition described above except that the component (6) is mixed. It is preferable that the component (1) is mixed with the component (6) in advance before the component (1) is mixed with the component (2), and the production method may be the following production method (a1-1) or the following production method (a2-1).

The production method (a1-1) is a method for producing the composition, including a step of mixing the component (1) with the component (3); a step of mixing the mixture containing the component (1) and the component (3) with the component (6); and a step of mixing the mixture containing the component (1), the component (3), and the component (6) with the component (2).

The production method (a2-1) is a method for producing the composition, including a step of mixing the component (1) with the component (6); a step of mixing the mixture containing the component (1) and the component (6) with the component (2); and a step of mixing the mixture containing the component (1), the component (2), and the component (6) with the component (3).

<<Measurement of Concentration of Perovskite Compound>>

The amount of the perovskite compound contained in the composition of the present invention is measured using an inductively coupled plasma spectrometer ICP-MS (for example, ELAN DRCII, manufactured by PerkinElmer, Inc.) and ion chromatography (for example, Integrion, manufactured by ThermoFisher Scientific Inc.).

The measurement of each component is performed after the perovskite compound is dissolved in a good solvent such as N,N-dimethylformamide.

<<Measurement of Quantum Yield and Absorption Rate>>

The quantum yield and the absorption rate (absorption) of the composition according to the present invention are measured with excitation light having a wavelength of 450 nm at room temperature in the atmosphere using an absolute PL quantum yield measuring device (for example, C9920-02, manufactured by Hamamatsu Photonics K. K.). Here, the absorption rate indicates a value represented by Expression "(Io−1)/Io" in a case where the intensity of light changes from Io to I due to absorption while passing through a certain material layer.

In the composition containing the component (1), the component (2), and the component (4), the measurement is performed by adjusting the mixing ratio such that the concentration of the perovskite compound contained in the composition is set to 500 ppm (μg/g) or 300 ppm (μg/g).

In the light-emitting composition according to the present embodiment which contains the component (1) and the component (2) and does not contain the silazane or modified product thereof, the quantum yield measured using the above-described measuring method is preferably in a range of 27% to 95%, more preferably in a range of 30% to 95%, and still more preferably in a range of 32% to 95%.

In the light-emitting composition according to the present embodiment which contains the component (1) and the component (2) and does not contain the silazane or modified product thereof, the absorption rate measured using the above-described measuring method is preferably in a range of 0.147 to 0.600, more preferably in a range of 0.150 to 0.600, and still more preferably in a range of 0.160 to 0.600.

In the light-emitting composition according to the present embodiment which contains the component (1), the component (2), and the silazane, and does not contain the modified product of the silazane, the quantum yield measured using the above-described measuring method is preferably in a range of 44% to 95%, more preferably in a range of 49% to 95%, and still more preferably in a range of 50% to 95%.

In the light-emitting composition according to the present embodiment which contains the component (1), the component (2) and the silazane, and does not contain the modified product of the silazane, the absorption rate measured using the above-described measuring method is preferably in a range of 0.146 to 0.600, more preferably in a range of 0.200 to 0.600, and still more preferably in a range of 0.220 to 0.600.

In the light-emitting composition according to the present embodiment which contains the component (1), the component (2), and the modified product of the silazane, the quantum yield measured using the above-described measuring method is preferably in a range of 68% to 95%, more preferably in a range of 69% to 95%, and still more preferably in a range of 71% to 95%.

In the light-emitting composition according to the present embodiment which contains the component (1), the component (2), and the modified product of the silazane, the absorption rate measured using the above-described measuring method is preferably in a range of 0.114 to 0.600, more preferably in a range of 0.140 to 0.600, and still more preferably in a range of 0.149 to 0.600.

<Film>

A film according to the present invention is a film formed of the composition which contains the component (1), the component (2), and the component (4') and in which the total content ratio of the component (1), the component (2), and the component (4') is 90% by mass or greater with respect to the total mass of the composition. The composition may contain the component (5) and/or the component (6).

The shape of the film is not particularly limited, and the film can be formed in an optional shape such as a sheet shape or a bar shape. In the present specification, the "bar shape" indicates a shape having an anisotropy. As the shape having an anisotropy, a shape of a plate having sides with different lengths is an exemplary example.

The thickness of the film may be in a range of 0.01 µm to 10 mm, in a range of 0.1 µm to 1 mm, or in a range of 1 µm to 0.5 mm.

The thickness of the film in the present specification can be obtained by measuring the thicknesses of the film at optional three points using a micrometer and calculating the average value of the measured values.

The film may be formed of a single layer or a plurality of layers. In a case of a plurality of layers, the same kind of composition according to the embodiment may be used for each layer or different kinds of composition according to the embodiment may be used for each layer.

The film can be obtained as a film formed on a substrate according to the production methods (i) to (iv) for producing a laminated structure described below. Further, the film can be obtained by being peeled off from the substrate.

<Laminated Structure>

The laminated structure according to the present invention has a plurality of layers, and at least one layer is the above-described film.

Among the plurality of layers included in the laminated structure, examples of layers other than the above-described film include optional layers such as a substrate, a barrier layer, and a light scattering layer.

The shape of the film to be laminated is not particularly limited, and the film can be formed in an optional shape such as a sheet shape or a bar shape.

(Substrate)

The layer which may be included in the laminated structure according to the present invention is not particularly limited, and examples thereof include a substrate.

The substrate is not particularly limited and may be a film. From the viewpoint of extracting light at the time of light emission, a transparent substrate is preferable. As the substrate, a polymer such as polyethylene terephthalate or known substrates such as glass can be used.

For example, the above-described film may be provided on the substrate in the laminated structure.

FIG. 1 is a cross-sectional view schematically showing the configuration of the laminated structure according to the present embodiment. A film 10 according to the present embodiment may be provided between a first substrate 20 and a second substrate 21 in a first laminated structure 1a. The film 10 is sealed by a sealing layer 22.

According to one aspect of the present invention, the laminated structure 1a includes the first substrate 20, the second substrate 21, the film 10 according to the present embodiment which is positioned between the first substrate 20 and the second substrate 21, and the sealing layer 22 and is configured such that the sealing layer is disposed on a surface that does not contact with the first substrate 20 and the second substrate 21 of the film 10.

(Barrier Layer)

The layer which may be included in the laminated structure according to the present invention is not particularly limited, and examples thereof include a barrier layer. The laminated structure may include a barrier layer from the viewpoint that the barrier layer protects the above-described composition from water vapor in outside air or the air in the atmosphere.

The barrier layer is not particularly limited, and a transparent barrier layer is preferable from the viewpoint of extracting emitted light. For example, a polymer such as polyethylene terephthalate or a known barrier layer such as a glass film can be used as the barrier layer.

(Light Scattering Layer)

The layer which can be included in the laminated structure according to the present invention is not particularly limited, and examples thereof include a light scattering layer. From the viewpoint of efficiently utilizing incident light, the laminated structure may include a light scattering layer.

The light scattering layer is not particularly limited, and a transparent light scattering layer is preferable from the viewpoint of extracting emitted light. For example, light scattering particles such as silica particles or a known light scattering layer such as an amplified diffusion film can be used.

<Light-Emitting Device>

A light-emitting device according to the present invention can be obtained by combining the composition according to the embodiment of the present invention or the laminated structure described above with a light source. The light-emitting device is a device that extracts light by irradiating the laminated structure or the composition placed on the back stage with light emitted from the light source and allowing the composition or the laminated structure to emit light. Among a plurality of layers included in the laminated structure in the light-emitting device, examples of layers other than the film, the substrate, the barrier layer, and the light scattering layer include optional layers such as a light reflection member, a brightness-reinforcing film, a prism sheet, a light-guiding plate, and a medium material layer between elements.

According to one aspect of the present invention, a light-emitting device 2 is formed by laminating a prism sheet 50, a light-guiding plate 60, the first laminated structure 1a, and a light source 30 in this order.

(Light Source)

The light source constituting the light-emitting device according to the present invention is not particularly limited. However, from the viewpoint of allowing the composition described above or the component (1) in the laminated structure to emit light, a light source having an emission wavelength of 600 nm or less is preferable. Examples of the light source include known light sources, for example, a light-emitting diode (LED) such as a blue light-emitting diode, a laser, and an EL.

(Light Reflection Member)

The layer which may be included in the laminated structure constituting the light-emitting device according to the present invention is not particularly limited, and examples thereof include a light reflection member. From the viewpoint of irradiating the composition described above or the laminated structure with light from the light source, the laminated structure may include the light reflection member. The light reflection member is not particularly limited and may be a reflective film.

Examples of the reflective film include known reflective films such as a reflecting mirror, a film formed of reflective particles, a reflective metal film, and a reflector.

(Brightness-Reinforcing Unit)

The layer which may be included in the laminated structure constituting the light-emitting device according to the present invention is not particularly limited, and examples thereof include a brightness-reinforcing unit. From the viewpoint of reflecting partial light to be returned to the direction in which the light is transmitted, the laminated structure may include the brightness-reinforcing unit.

(Prism Sheet)

The layer which may be included in the laminated structure constituting the light-emitting device according to the present invention is not particularly limited, and examples thereof include a prism sheet. A prism sheet typically includes a base material portion and a prism portion. Further, the base material portion may not be provided depending on a member adjacent to the base material portion. The prism sheet is obtained by being bonded to a member adjacent thereto through an optional appropriate adhesion layer (for example, an adhesive layer or a pressure-sensitive adhesive layer). The prism sheet is configured such that a plurality of unit prisms which become projections are arranged in parallel with one another on a side (rear side) opposite to a viewing side. Light transmitted through the prism sheet is likely to be focused by arranging the projections of the prism sheet toward the rear side. Further, in a case where the projections of the prism sheet are arranged toward the rear side, the quantity of light to be reflected without being incident on the prism sheet is small compared to a case where the projections are arranged toward the viewing side, and a display with high brightness can be obtained.

(Light-Guiding Plate)

The layer which may be included in the laminated structure constituting the light-emitting device according to the present invention is not particularly limited, and examples thereof include a light-guiding plate. As the light-guiding plate, an optional appropriate light-guiding plate such as a light-guiding plate in which a lens pattern is formed on the rear side such that light from the lateral direction can be deflected in the thickness direction or a light-guiding plate in which a prism shape or the like is formed on the rear side and/or the viewing side is used.

(Medium Material Layer Between Elements)

The layer which may be included in the laminated structure constituting the light-emitting device according to the present invention is not particularly limited, and examples thereof include a layer (medium material layer between elements) formed of one or more medium materials on an optical path between elements (layers) adjacent to each other.

One or more mediums included in the medium material layer between element are not particularly limited, and examples thereof include vacuum, air, gas, an optical material, an adhesive, an optical adhesive, glass, a polymer, a solid, a liquid, a gel, a curing material, an optical bonding material, a refractive index matching or refractive index mismatching material, a refractive index gradient material, a cladding or anti-gladding material, a spacer, a silica gel, a brightness-reinforcing material, a scattering or diffusing material, a reflective or anti-reflective material, a wavelength selective material, a wavelength selective anti-reflective material, a color filter, and suitable media known in the technical field.

Specific examples of the light-emitting device according to the present invention include those provided with wavelength conversion materials for an EL display and a liquid crystal display.

Examples of the light-emitting device include an illumination emitting white light, which is obtained by molding the composition according to the embodiment of the present invention, disposing the composition behind a blue light emitting diode serving as a light source, and converting blue light into green light or red light, and specific examples thereof include embodiments (E1) to (E4).

A backlight (E1) (on-edge type backlight) is a backlight that converts blue light to green light or red light by putting the composition of the present invention into a glass tube or the like so as to be sealed and disposing the glass tube or the like between a light-guiding plate and a blue light-emitting diode serving as a light source such that the glass tube or the like is along with an end surface (side surface) of the light-guiding plate.

A backlight (E2) (surface-mounting type backlight) is a backlight that converts blue light to be applied to a sheet after passing through a light-guiding plate from a blue light-emitting diode placed on an end surface (side surface) of the light-guiding plate to green light or red light by forming the sheet using the composition of the present invention and placing a film obtained by interposing the sheet between two barrier films so as to be sealed on the light-guiding plate.

A backlight (E3) (on-chip type backlight) is a backlight that converts blue light to be applied to green light or red light by dispersing the composition of the present invention in a resin or the like and placing the resin or the like in the vicinity of a light-emitting unit of a blue light-emitting diode.

A backlight (E4) is a backlight that converts blue light to be applied from a light source to green light or red light by dispersing the composition of the present invention in a resist and placing the resist on a color filter.

<Display>

Figure 2:
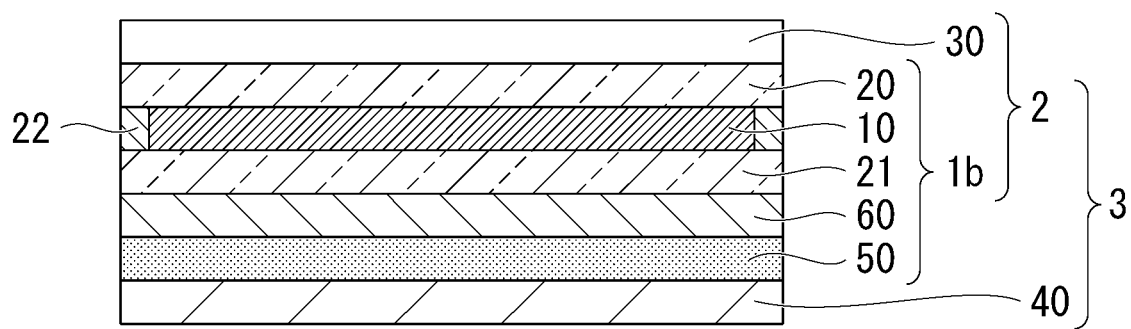
FIG. 2 is a cross-sectional view showing an embodiment of a display according to the present invention.

As shown in FIG. 2, a display 3 according to the present embodiment includes a liquid crystal panel 40 and the light-emitting device 2 described above in this order from the viewing side. The light-emitting device 2 includes a second laminated structure 1b and a light source 30. The second laminated structure 1b is formed of the first laminated structure 1a which further includes a prism sheet 50 and a light-guiding plate 60. The display may further include other appropriate optional members.

According to one aspect of the present invention, the display is the liquid crystal display 3 obtained by laminating the liquid crystal panel 40, the prism sheet 50, the light-guiding plate 60, the first laminated structure 1a, and the light source 30 in this order.

(Liquid Crystal Panel)

The liquid crystal panel typically includes a liquid crystal cell; a viewing-side polarizing plate disposed on a viewing side of the liquid crystal cell; and a rear-surface-side polarizing plate disposed on a rear surface side of the liquid crystal cell. The viewing-side polarizing plate and the rear-surface-side polarizing plate can be disposed such that respective absorption axes are substantially orthogonal or parallel to each other.

(Liquid Crystal Cell)

The liquid crystal cell includes a pair of substrates; and a liquid crystal layer serving as a display medium interposed between the substrates. In a typical configuration, a color filter and a black matrix are provided on one substrate. Further, a switching element that controls electro-optical characteristics of a liquid crystal; a scanning line that sends a gate signal to the switching element and a signal line that sends a source signal to the switching element; and a pixel electrode and a counter electrode are provided on the other substrate. The interval (cell gap) between the substrates can be controlled by a spacer or the like. For example, an alignment film formed of polyimide can be provided on a side of the substrate contact in the liquid crystal layer.

(Polarizing Plate)

The polarizing plate typically includes a polarizer; and a protective layer disposed on both sides of the polarizer. Typically, the polarizer is an absorption type polarizer.

As the polarizer, an appropriate optional polarizer is used. Examples thereof include a polarizer obtained by adsorbing a dichroic material such as iodine or a dichroic dye on a hydrophilic polymer such as a polyvinyl alcohol-based film, a partially formalized polyvinyl alcohol-based film, or an ethylene-vinyl acetate copolymer-based partially saponified film so as to be uniaxially stretched; and a polyene-based alignment film such as a dehydrated product of polyvinyl alcohol or a dehydrochlorinated product of polyvinyl chloride. Among these, a polarizer obtained by adsorbing a dichroic material such as iodine on a polyvinyl alcohol-based film so as to be uniaxially stretched is particularly preferable from the viewpoint of a high dichroic ratio.

As the applications of the composition according to the present invention, a wavelength conversion material for a light-emitting diode (LED) is an exemplary example.

<LED>

The composition according to the present invention can be used as a material for a light-emitting layer of an LED.

As the LED containing the composition of the present invention, an LED which has a structure in which the composition of the present invention and conductive particles such as ZnS are mixed and laminated in a film shape, an n-type transport layer is laminated on one surface, and a p-type transport layer is laminated on the other surface and emits light by circulating the current so that positive holes of a p-type semiconductor and electrons of an n-type semiconductor cancel the charge in the particles in the component (1) and the component (2) contained in the bonding surface of the composition is an exemplary example.

<Solar Cell>

The composition of the present invention can be used as an electron transport material contained in an active layer of a solar cell.

The configuration of the solar cell is not particularly limited, and examples thereof include a solar cell which includes a fluorine-doped tin oxide (FTO) substrate, a titanium oxide dense layer, a porous aluminum oxide layer, an active layer containing the composition of the present invention, a hole transport layer such as 2,2',7,7'-tetrakis-(N,N'-di-p-methoxyphenylamine)-9,9'-spirobifluorene (Spiro-MeOTAD), and a silver (Ag) electrode in this order.

The titanium oxide dense layer has a function of transporting electrons, an effect of suppressing the roughness of FTO, and a function of suppressing movement of inverse electrons.

The porous aluminum oxide layer has a function of improving the light absorption efficiency.

The composition of the present invention which is contained in the active layer plays a role of charge separation and electron transport.

<Method for Producing Laminated Structure>

Examples of a method for producing a laminated structure include the following production methods (i), (ii), (iii), and (iv).

The production method (i) is a method for producing a laminated structure, including a step of mixing the component (1), the component (2), the component (3), and the component (4'), a step of coating a substrate with the obtained mixture, and a step of removing the solvent.

The production method (ii) is a method for producing a laminated structure, including a step of mixing the component (1), the component (2), and the polymer dissolved in a solvent, a step of coating a substrate with the obtained mixture, and a step of removing the solvent.

The production method (iii) is a method for producing a laminated structure, including a step of laminating the composition, which contains the component (1), the component (2), and the component (4') and in which the total content ratio of the component (1), the component (2), and the component (4') is 90% by mass or greater with respect to the total mass of the composition, on a substrate;

The production method (iv) is a method for producing a laminated structure including a step of mixing the component (1), the component (2), and the polymerizable compound, a step of coating a substrate with the obtained mixture, and a step of polymerizing the polymerizable compound.

The mixing step and the step of removing the solvent which are included in the production method (i), the mixing step and the step of removing the solvent which are included in the production method (ii), and the mixing step and the step of polymerizing the polymerizable compound which are included in the production method (iv) can be designed to be the same steps as those included in the above-described method for producing the composition which contains the component (1), the component (2), and the component (4') and in which the total content ratio of the component (1), the component (2), and the component (4') is 90% by mass or greater with respect to the total mass of the composition.

Each step of coating a substrate with the mixture, included in the production methods (i), (ii), and (iv) is not particularly limited and can be carried out using a known coating method such as a gravure coating method, a bar coating method, a printing method, a spray method, a spin coating method, a dip method, or a die coating method.

In the step of laminating the mixture on the substrate, included in the production method (iii), an optional adhesive can be used.

The adhesive is not particularly limited as long as the component (1) and a compound of the component (2) are not dissolved therein, and a known adhesive can be used.

The method for producing a laminated structure may include a step of further laminating an optional film on the laminated structure obtained by the production methods (i) to (iv).

Examples of optional films to be laminated include a reflective film and a diffusion film.

An optional adhesive can be used in the step of laminating the film on the laminated structure.

The above-described adhesive is not particularly limited as long as the component (1) and a compound of the component (2) are not dissolved therein, and a known adhesive can be used.

<Method for Producing Light-Emitting Device>

A production method including a step of placing the light source, the composition on the optical path of a back stage from the light source, or the laminated structure is an exemplary example.

Further, the technical scope of the present invention is not limited to the above-described embodiments, and various modifications can be added within a range not departing from the spirit of the present invention.

EXAMPLES

Hereinafter, the embodiments of the present invention will be described in more detail based on examples and comparative example, but the present invention is not limited to the following examples.

<<Measurement of Concentration of Perovskite Compound>>

The concentration of the perovskite compound in each composition obtained in Examples 1 to 12 and Comparative Examples 1 to 5 was obtained according to the following method.

First, N,N-dimethylformamide was added to the dispersion liquid containing the solvent and the perovskite compound which was obtained by re-dispersion so that the perovskite compound was dissolved therein.

Thereafter, the concentration was measured using ICP-MS (ELAN DRCII, manufactured by PerkinElmer, Inc.) and ion chromatography (Integrion, manufactured by ThermoFisher Scientific Inc.).

<<Measurement of Quantum Yield and Absorption Rate>>

The quantum yield and the absorption rate of each composition obtained in Examples 1 to 12 and Comparative Examples 1 to 5 were measured with excitation light having a wavelength of 450 nm at room temperature in the atmosphere using an absolute PL quantum yield measuring device (C9920-02, manufactured by Hamamatsu Photonics K. K.).

<<Measurement of Average Particle Diameter of Component (2)>>

The average particle diameter of the component (2) used in each example was set as the particle diameter of d50 at the time of measurement of the particle size distribution using a scattering particle size distribution measuring device (laser diffraction, MT3300, manufactured by MicrotracBel Corp.).

The average particle diameter of aluminum oxide (AA-02, α-alumina, manufactured by Sumitomo Chemical Co., Ltd.) was 0.2 μm.

The average particle diameter of aluminum oxide (AA-3, α-alumina, manufactured by Sumitomo Chemical Co., Ltd.) was 3.4 μm.

The average particle diameter of aluminum oxide (AA-18, α-alumina, manufactured by Sumitomo Chemical Co., Ltd.) was 20.3 μm.

The average particle diameter of zinc oxide (ZnO, manufactured by Kojundo Chemical Laboratory Co., Ltd.) was 1 μm.

The average particle diameter of niobium oxide ($Nb_2O_5$, manufactured by Kojundo Chemical Laboratory Co., Ltd.) was 1 μm.

The average particle diameter of aluminum oxide (AKP-53, α-alumina, manufactured by Sumitomo Chemical Co., Ltd.) was 0.18 μm.

The average particle diameter of aluminum oxide (AKP-3000, α-alumina, manufactured by Sumitomo Chemical Co., Ltd.) was 0.7 μm.

The average particle diameter of aluminum oxide (AKP-30, α-alumina, manufactured by Sumitomo Chemical Co., Ltd.) was 0.27 μm.

The average particle diameter of aluminum oxide (AKP-50, α-alumina, manufactured by Sumitomo Chemical Co., Ltd.) was 0.2 μm.

The average particle diameter of aluminum oxide (KC-501, γ-alumina, manufactured by Sumitomo Chemical Co., Ltd.) was 1.5 μm.

The average particle diameter of aluminum oxide (AKP-G15, γ-alumina, manufactured by Sumitomo Chemical Co., Ltd.) was 0.015 μm.

<<Measurement of Bulk Density of Component (2)>>

The bulk density (heavy) of the component (2) used in each example was measured using a method for the heavy bulk specific gravity (JIS R 9301-2-3, 1999).

The bulk density (heavy) of aluminum oxide (AA-3, α-alumina, manufactured by Sumitomo Chemical Co., Ltd.) was 1.5 g/cm$^3$.

The bulk density (heavy) of aluminum oxide (AA-18, α-alumina, manufactured by Sumitomo Chemical Co., Ltd.) was 2.4 g/cm$^3$.

The bulk density (heavy) of aluminum oxide (AKP-53, α-alumina, manufactured by Sumitomo Chemical Co., Ltd.) was 1.4 g/cm$^3$.

The bulk density (heavy) of aluminum oxide (AKP-3000, α-alumina, manufactured by Sumitomo Chemical Co., Ltd.) was 0.8 g/cm$^3$.

The bulk density (heavy) of aluminum oxide (AKP-30, α-alumina, manufactured by Sumitomo Chemical Co., Ltd.) was 1.3 g/cm$^3$.

The bulk density (heavy) of aluminum oxide (AKP-50, α-alumina, manufactured by Sumitomo Chemical Co., Ltd.) was 1.3 g/cm$^3$.

The bulk density (heavy) of aluminum oxide (KC-501, γ-alumina, manufactured by Sumitomo Chemical Co., Ltd.) was 0.3 g/cm$^3$.

The bulk density (heavy) of aluminum oxide (AKP-G15, γ-alumina, manufactured by Sumitomo Chemical Co., Ltd.) was 0.19 g/cm$^3$.

<<Measurement of Specific Surface Area of Component (2)>>

The specific surface area of the component (2) used in each example was obtained by measuring the BET specific surface area according to a nitrogen gas adsorption method using a specific surface area measuring device (Macsorb, manufactured by Mountech Co., Ltd.).

The BET specific surface area of aluminum oxide (AA-02, α-alumina, manufactured by Sumitomo Chemical Co., Ltd.) was 7.5 m$^2$/g.

The BET specific surface area of aluminum oxide (AA-3, α-alumina, manufactured by Sumitomo Chemical Co., Ltd.) was 0.5 m$^2$/g.

The BET specific surface area of aluminum oxide (AA-18, α-alumina, manufactured by Sumitomo Chemical Co., Ltd.) was 0.1 m$^2$/g.

The BET specific surface area of zinc oxide (ZnO, manufactured by Kojundo Chemical Laboratory Co., Ltd.) was 4.7 m$^2$/g.

The BET specific surface area of niobium oxide ($Nb_2O_5$, manufactured by Kojundo Chemical Laboratory Co., Ltd.) was 6.3 m$^2$/g.

The BET specific surface area of aluminum oxide (AKP-53, α-alumina, manufactured by Sumitomo Chemical Co., Ltd.) was 11.7 m$^2$/g.

The BET specific surface area of aluminum oxide (AKP-3000, α-alumina, manufactured by Sumitomo Chemical Co., Ltd.) was 4.5 m$^2$/g.

The BET specific surface area of aluminum oxide (AKP-30, α-alumina, manufactured by Sumitomo Chemical Co., Ltd.) was 6.7 m$^2$/g.

The BET specific surface area of aluminum oxide (AKP-50, α-alumina, manufactured by Sumitomo Chemical Co., Ltd.) was 10.3 m$^2$/g.

The BET specific surface area of aluminum oxide (KC-501, γ-alumina, manufactured by Sumitomo Chemical Co., Ltd.) was 200 m$^2$/g.

The BET specific surface area of aluminum oxide (AKP-G15, γ-alumina, manufactured by Sumitomo Chemical Co., Ltd.) was 164 m$^2$/g.

<<Crystal Structure of Component (2)>>

The crystal structure of the component (2) used in each example was identified by measuring the X-ray diffraction pattern using an X-ray diffraction measuring device (XRD, Cu Kα rays, X'pert PRO MPD, manufactured by Spectris plc).

It was confirmed that aluminum oxide (AA-02, α-alumina, manufactured by Sumitomo Chemical Co., Ltd.), aluminum oxide (AA-3, α-alumina, manufactured by Sumitomo Chemical Co., Ltd.), aluminum oxide (AA-18, α-alumina, manufactured by Sumitomo Chemical Co., Ltd.), aluminum oxide (AKP-53, α-alumina, manufactured by Sumitomo Chemical Co., Ltd.), aluminum oxide (AKP-3000, α-alumina, manufactured by Sumitomo Chemical Co., Ltd.), aluminum oxide (AKP-30, α-alumina, manufactured by Sumitomo Chemical Co., Ltd.), and aluminum oxide (AKP-50, α-alumina, manufactured by Sumitomo Chemical Co., Ltd.) had peaks derived from crystalline α-alumina at positions where 2θ was 35°, 43°, and 57°.

It was confirmed that zinc oxide (ZnO, manufactured by Kojundo Chemical Laboratory Co., Ltd.) had peaks derived from crystalline zinc oxide at positions where 2θ was 32°, 34°, and 36°.

It was confirmed that niobium oxide ($Nb_2O_5$, manufactured by Kojundo Chemical Laboratory Co., Ltd.) had peaks derived from crystalline niobium oxide at positions where 2θ was 27°, 28°, and 37°.

<<Measurement of Average Feret Diameter of Component (1)>>

The perovskite compound was observed using a transmission electron microscope (JEM-2200FS, manufactured by JEOL Ltd.). As a sample for observation, a sample obtained by collecting the perovskite compound from a dispersion liquid composition containing the perovskite compound on a grid provided with a support film was used. The sample was observed by setting the acceleration voltage to 200 kV.

The average Feret diameter was set as an average value of the Feret diameters of 20 particles (primary particles) of the perovskite compound.

Synthesis of Composition

Example 1

0.814 g of cesium carbonate, 40 mL of a solvent of 1-octadecene, and 2.5 mL of oleic acid were mixed. A cesium carbonate solution 1 was prepared by stirring the solution using a magnetic stirrer and heating the resulting solution at 150° C. for 1 hour while circulating nitrogen.

0.276 g of lead bromide ($PbBr_2$) was mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide dispersion liquid.

The lead bromide dispersion liquid was heated to a temperature of 160° C., and 1.6 mL of the above-described cesium carbonate solution 1 was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate. The obtained perovskite compound was dispersed in 5 mL of toluene, 500 μL of a dispersion liquid was taken out, and the compound was re-dispersed in 4.5 mL of toluene to obtain a dispersion liquid containing the perovskite compound and the solvent.

The concentration of the perovskite compound measured using ICP-MS and ion chromatography was 1500 ppm (μg/g).

As the result of measuring the X-ray diffraction pattern of the compound recovered by naturally drying the solvent using an X-ray diffraction measuring device (XRD, Cu Kα rays, X'pert PRO MPD, manufactured by Spectris plc), it was confirmed that a peak derived from (hkl)=(001) was at a position where 2θ was 14° and the compound had a three-dimensional perovskite type crystal structure.

The average Feret diameter of the perovskite compound observed using a TEM was 11 nm.

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with a toluene such that the amount of PMMA reached 16.5% by mass with respect to the total mass of the methacrylic resin and toluene, and the solution was heated at 60° C. for 3 hours to obtain a solution in which the polymer was dissolved.

2.5 g of the solution in which the polymer was dissolved and 0.021 g of aluminum oxide (AA-02, α-alumina, manufactured by Sumitomo Chemical Co., Ltd.) were mixed while being stirred using a stirrer, thereby obtaining a dispersion liquid in which the polymer and crystalline inorganic fine particles were dispersed.

0.48 g of the dispersion liquid in which the polymer and crystalline inorganic fine particles were dispersed and 0.027 g of the dispersion liquid containing the perovskite compound and the solvent were mixed in a glass petri dish (32 φmm) and naturally dried, thereby obtaining a composition containing 5 wt % of α-alumina (AA-02) and 500 ppm (μg/g) of the perovskite compound.

The obtained composition was cut into a size of 1 cm×1 cm×50 μm, and the quantum yield and the absorption rate thereof were measured using a quantum yield measuring device. As the result, the quantum yield thereof was 34%, and the absorption rate thereof was 0.243.

Example 2

2.5 g of the solution in which the polymer was dissolved, which was obtained in Example 1 and 0.021 g of aluminum oxide (AA-3, α-alumina, manufactured by Sumitomo Chemical Co., Ltd.) were mixed while being stirred using a stirrer, thereby obtaining a dispersion liquid in which the polymer and crystalline inorganic fine particles were dispersed.

0.48 g of the dispersion liquid in which the polymer and crystalline inorganic fine particles were dispersed and 0.027 g of the dispersion liquid containing the perovskite compound and the solvent, obtained in Example 1, were mixed in a glass petri dish (32 φmm) and naturally dried, thereby obtaining a composition containing 5 wt % of α-alumina (AA-3) and 500 ppm (μg/g) of the perovskite compound.

The obtained composition was cut into a size of 1 cm×1 cm×50 μm, and the quantum yield and the absorption rate thereof were measured using a quantum yield measuring device. As the result, the quantum yield thereof was 37%, and the absorption rate thereof was 0.193.

Example 3

2.5 g of the solution in which the polymer was dissolved, which was obtained in Example 1 and 0.021 g of aluminum oxide (AA-18, α-alumina, manufactured by Sumitomo Chemical Co., Ltd.) were mixed while being stirred using a stirrer, thereby obtaining a dispersion liquid in which the polymer and crystalline inorganic fine particles were dispersed.

0.48 g of the dispersion liquid in which the polymer and crystalline inorganic fine particles were dispersed and 0.027 g of the dispersion liquid containing the perovskite compound and the solvent, which was obtained in Example 1, were mixed in a glass petri dish (32 φmm) and naturally dried, thereby obtaining a composition containing 5 wt % of α-alumina (AA-18) and 500 ppm (g/g) of the perovskite compound.

The obtained composition was cut into a size of 1 cm×1 cm×50 m, and the quantum yield and the absorption rate thereof were measured using a quantum yield measuring device. As the result, the quantum yield thereof was 32%, and the absorption rate thereof was 0.168.

Example 4

The dispersion liquid containing the perovskite compound and the solvent which was obtained in Example 1 was mixed with a polysilazane (Durazane 1500 Slow Cure, manufactured by Merck Performance Materials Ltd.), thereby obtaining a dispersion liquid containing the perovskite compound, the solvent, and the polysilazane.

In the dispersion liquid, the molar ratio of Si/Pb was 76.

2.5 g of the solution in which the polymer was dissolved, which was obtained in Example 1 and 0.021 g of aluminum oxide (AA-02, α-alumina, manufactured by Sumitomo Chemical Co., Ltd.) were mixed while being stirred using a stirrer, thereby obtaining a dispersion liquid in which the polymer and crystalline inorganic fine particles were dispersed.

0.48 g of the dispersion liquid in which the polymer and crystalline inorganic fine particles were dispersed and 0.027 g of the dispersion liquid containing the perovskite compound, the solvent, and the polysilazane were mixed in a glass petri dish (32 φmm) and naturally dried, thereby obtaining a composition containing 5 wt % of α-alumina (AA-02) and 500 ppm (μg/g) of the perovskite compound.

The obtained composition was cut into a size of 1 cm×1 cm×50 μm, and the quantum yield and the absorption rate thereof were measured using a quantum yield measuring device. As the result, the quantum yield thereof was 59%, and the absorption rate thereof was 0.287.

Example 5

The dispersion liquid containing the perovskite compound and the solvent which was obtained in Example 1 was mixed with a polysilazane (Durazane 1500 Slow Cure, manufactured by Merck Performance Materials Ltd.), thereby obtaining a dispersion liquid containing the perovskite compound, the solvent, and the polysilazane.

In the dispersion liquid, the molar ratio of Si/Pb was 76.

2.5 g of the solution in which the polymer was dissolved, which was obtained in Example 1 and 0.021 g of aluminum oxide (AA-3, α-alumina, manufactured by Sumitomo Chemical Co., Ltd.) were mixed while being stirred using a stirrer, thereby obtaining a dispersion liquid in which the polymer and crystalline inorganic fine particles were dispersed.

0.48 g of the dispersion liquid in which the polymer and crystalline inorganic fine particles were dispersed and 0.027 g of the dispersion liquid containing the perovskite compound, the solvent, and the polysilazane were mixed in a glass petri dish (32φmm) and naturally dried, thereby obtaining a composition containing 5 wt % of α-alumina (AA-3) and 500 ppm (μg/g) of the perovskite compound.

The obtained composition was cut into a size of 1 cm×1 cm×50 μm, and the quantum yield and the absorption rate thereof were measured using a quantum yield measuring device. As the result, the quantum yield thereof was 58%, and the absorption rate thereof was 0.256.

Example 6

The dispersion liquid containing the perovskite compound and the solvent which was obtained in Example 1 was mixed with a polysilazane (Durazane 1500 Slow Cure, manufactured by Merck Performance Materials Ltd.), thereby obtaining a dispersion liquid containing the perovskite compound, the solvent, and the polysilazane.

A dispersion liquid containing the perovskite compound, the solvent, and the polysilazane was obtained. A dispersion liquid containing the perovskite compound, the solvent, and the polysilazane was obtained. In the dispersion liquid, the molar ratio of Si/Pb was 76.

2.5 g of the solution in which the polymer was dissolved, which was obtained in Example 1 and 0.021 g of aluminum oxide (AA-18, α-alumina, manufactured by Sumitomo Chemical Co., Ltd.) were mixed while being stirred using a stirrer, thereby obtaining a dispersion liquid in which the polymer and crystalline inorganic fine particles were dispersed.

0.48 g of the dispersion liquid in which the polymer and crystalline inorganic fine particles were dispersed and 0.027 g of the dispersion liquid containing the perovskite compound, the solvent, and the polysilazane were mixed in a glass petri dish (32 φmm) and naturally dried, thereby obtaining a composition containing 5 wt % of α-alumina (AA-18) and 500 ppm (μg/g) of the perovskite compound.

The obtained composition was cut into a size of 1 cm×1 cm×50 μm, and the quantum yield and the absorption rate thereof were measured using a quantum yield measuring device. As the result, the quantum yield thereof was 55%, and the absorption rate thereof was 0.22.

Example 7

The dispersion liquid containing the perovskite compound and the solvent which was obtained in Example 1 was mixed with a polysilazane (Durazane 1500 Slow Cure, manufactured by Merck Performance Materials Ltd.), thereby obtaining a dispersion liquid containing the perovskite compound, the solvent, and the polysilazane.

In the dispersion liquid, the molar ratio of Si/Pb was 76.

2.5 g of the solution in which the polymer was dissolved, which was obtained in Example 1 and 0.021 g of zinc oxide (ZnO, manufactured by Kojundo Chemical Laboratory Co., Ltd.) were mixed while being stirred using a stirrer, thereby obtaining a dispersion liquid in which the polymer and crystalline inorganic fine particles were dispersed.

0.48 g of the dispersion liquid in which the polymer and crystalline inorganic fine particles were dispersed and 0.027 g of the dispersion liquid containing the perovskite compound, the solvent, and the polysilazane were mixed in a glass petri dish (32 φmm) and naturally dried, thereby obtaining a composition containing 5 wt % of zinc oxide and 500 ppm (μg/g) of the perovskite compound.

The obtained composition was cut into a size of 1 cm×1 cm×50 μm, and the quantum yield and the absorption rate thereof were measured using a quantum yield measuring device. As the result, the quantum yield thereof was 49%, and the absorption rate thereof was 0.279.

Example 8

The dispersion liquid containing the perovskite compound and the solvent which was obtained in Example 1 was mixed with a polysilazane (Durazane 1500 Slow Cure, manufactured by Merck Performance Materials Ltd.), thereby obtaining a dispersion liquid containing the perovskite compound, the solvent, and the polysilazane.

In the dispersion liquid, the molar ratio of Si/Pb was 76.

2.5 g of the solution in which the polymer was dissolved, which was obtained in Example 1 and 0.021 g of niobium oxide ($Nb_2O_5$, manufactured by Kojundo Chemical Laboratory Co., Ltd.) were mixed while being stirred using a stirrer, thereby obtaining a dispersion liquid in which the polymer and crystalline inorganic fine particles were dispersed.

0.48 g of the dispersion liquid in which the polymer and crystalline inorganic fine particles were dispersed and 0.027 g of the dispersion liquid containing the perovskite compound, the solvent, and the polysilazane were mixed in a glass petri dish (32 φmm) and naturally dried, thereby obtaining a composition containing 5 wt % of zinc oxide and 500 ppm (μg/g) of the perovskite compound.

The obtained composition was cut into a size of 1 cm×1 cm×50 μm, and the quantum yield and the absorption rate thereof were measured using a quantum yield measuring device. As the result, the quantum yield thereof was 67%, and the absorption rate thereof was 0.378.

Example 9

The dispersion liquid containing the perovskite compound and the solvent which was obtained in Example 1 was mixed with a polysilazane (Durazane 1500 Slow Cure, manufactured by Merck Performance Materials Ltd.), thereby obtaining 5.1 mL of a dispersion liquid containing the perovskite compound, the solvent, and the polysilazane.

In the dispersion liquid, the molar ratio of Si/Pb was 76.

The dispersion liquid was subjected to a modification treatment for 1 day while being stirred using a stirrer at 25° C. under a humidity condition of 80%.

2.5 g of the solution in which the polymer was dissolved, which was obtained in Example 1 and 0.021 g of aluminum oxide (AKP-53, α-alumina, manufactured by Sumitomo Chemical Co., Ltd.) were mixed while being stirred using a stirrer, thereby obtaining a dispersion liquid in which the polymer and crystalline inorganic fine particles were dispersed.

0.96 g of the dispersion liquid in which the polymer and crystalline inorganic fine particles were dispersed and 0.032 g of the dispersion liquid which had been subjected to the modification treatment were mixed in a glass petri dish (32 φmm) and naturally dried, thereby obtaining a composition containing 5 wt % of α-alumina (AKP-53) and 300 ppm (μg/g) of the perovskite compound.

The obtained composition was cut into a size of 1 cm×1 cm×100 μm, and the quantum yield and the absorption rate thereof were measured using a quantum yield measuring device. As the result, the quantum yield thereof was 78%, and the absorption rate thereof was 0.149.

Example 10

The dispersion liquid containing the perovskite compound and the solvent which was obtained in Example 1 was mixed with a polysilazane (Durazane 1500 Slow Cure, manufactured by Merck Performance Materials Ltd.), thereby obtaining 5.1 mL of a dispersion liquid containing the perovskite compound, the solvent, and the polysilazane. In the dispersion liquid, the molar ratio of Si/Pb was 76. The above-described dispersion liquid was subjected to a modification treatment for 1 day while being stirred using a stirrer at 25° C. under a humidity condition of 80%.

2.5 g of the solution in which the polymer was dissolved, which was obtained in Example 1 and 0.021 g of aluminum oxide (AKP-3000, α-alumina, manufactured by Sumitomo Chemical Co., Ltd.) were mixed while being stirred using a stirrer, thereby obtaining a dispersion liquid in which the polymer and crystalline inorganic fine particles were dispersed.

0.96 g of the dispersion liquid in which the polymer and crystalline inorganic fine particles were dispersed and 0.032 g of the dispersion liquid which had been subjected to the modification treatment were mixed in a glass petri dish (32 φmm) and naturally dried, thereby obtaining a composition containing 5 wt % of α-alumina (AKP-3000) and 300 ppm (μg/g) of the perovskite compound.

The obtained composition was cut into a size of 1 cm×1 cm×100 μm, and the quantum yield and the absorption rate thereof were measured using a quantum yield measuring device. As the result, the quantum yield thereof was 71%, and the absorption rate thereof was 0.265.

Example 11

The dispersion liquid containing the perovskite compound and the solvent which was obtained in Example 1 was mixed with a polysilazane (Durazane 1500 Slow Cure, manufactured by Merck Performance Materials Ltd.), thereby obtaining 5.1 mL of a dispersion liquid containing the perovskite compound, the solvent, and the polysilazane. In the dispersion liquid, the molar ratio of Si/Pb was 76. The above-described dispersion liquid was subjected to a modification treatment for 1 day while being stirred using a stirrer at 25° C. under a humidity condition of 80%.

2.5 g of the solution in which the polymer was dissolved, which was obtained in Example 1 and 0.021 g of aluminum oxide (AKP-30, α-alumina, manufactured by Sumitomo Chemical Co., Ltd.) were mixed while being stirred using a stirrer, thereby obtaining a dispersion liquid in which the polymer and crystalline inorganic fine particles were dispersed.

0.96 g of the dispersion liquid in which the polymer and crystalline inorganic fine particles were dispersed and 0.032 g of the dispersion liquid which had been subjected to the modification treatment were mixed in a glass petri dish (32 φmm) and naturally dried, thereby obtaining a composition containing 5 wt % of α-alumina (AKP-30) and 300 ppm (μg/g) of the perovskite compound.

The obtained composition was cut into a size of 1 cm×1 cm×100 μm, and the quantum yield and the absorption rate thereof were measured using a quantum yield measuring device. As the result, the quantum yield thereof was 71%, and the absorption rate thereof was 0.206.

Example 12

The dispersion liquid containing the perovskite compound and the solvent which was obtained in Example 1 was mixed with a polysilazane (Durazane 1500 Slow Cure, manufactured by Merck Performance Materials Ltd.), thereby obtaining 5.1 mL of a dispersion liquid containing the perovskite compound, the solvent, and the polysilazane. In the dispersion liquid, the molar ratio of Si/Pb was 76. The above-described dispersion liquid was subjected to a modification treatment for 1 day while being stirred using a stirrer at 25° C. under a humidity condition of 80%.

2.5 g of the solution in which the polymer was dissolved, which was obtained in Example 1 and 0.021 g of aluminum oxide (AKP-50, α-alumina, manufactured by Sumitomo Chemical Co., Ltd.) were mixed while being stirred using a stirrer, thereby obtaining a dispersion liquid in which the polymer and crystalline inorganic fine particles were dispersed.

0.96 g of the dispersion liquid in which the polymer and crystalline inorganic fine particles were dispersed and 0.032 g of the dispersion liquid which had been subjected to the modification treatment were mixed in a glass petri dish (32 φmm) and naturally dried, thereby obtaining a composition containing 5 wt % of α-alumina (AKP-50) and 300 ppm (μg/g) of the perovskite compound.

The obtained composition was cut into a size of 1 cm×1 cm×100 μm, and the quantum yield and the absorption rate thereof were measured using a quantum yield measuring device. As the result, the quantum yield thereof was 72%, and the absorption rate thereof was 0.222.

Comparative Example 1

0.48 g of the solution in which the polymer was dissolved, which was obtained in Example 1 and 0.027 g of the dispersion liquid containing the perovskite compound and the solvent, which was obtained in Example 1, were mixed in a glass petri dish (32 φmm) and naturally dried, thereby obtaining a composition containing 500 ppm (μg/g) of the perovskite compound.

The obtained composition was cut into a size of 1 cm×1 cm×50 μm, and the quantum yield and the absorption rate thereof were measured using a quantum yield measuring device. As the result, the quantum yield thereof was 26%, and the absorption rate thereof was 0.146.

Comparative Example 2

2.5 g of the solution in which the polymer was dissolved, which was obtained in Example 1 and 0.021 g of aluminum oxide (KC-501, γ-alumina, manufactured by Sumitomo Chemical Co., Ltd.) were mixed while being stirred using a stirrer, thereby obtaining a dispersion liquid in which the polymer and crystalline inorganic fine particles were dispersed.

0.48 g of the solution in which the polymer and the crystalline inorganic fine particles were dispersed and 0.027 g of the dispersion liquid containing the perovskite compound and the solvent, which was obtained in Example 1, were mixed in a glass petri dish (32 φmm) and naturally dried, thereby obtaining a composition containing 5 wt % of the γ-alumina and 500 ppm (g/g) of the perovskite compound.

The obtained composition was cut into a size of 1 cm×1 cm×50 μm, and the quantum yield and the absorption rate thereof were measured using a quantum yield measuring device. As the result, the quantum yield thereof was 22%, and the absorption rate thereof was 0.129.

Comparative Example 3

2.5 g of the solution in which the polymer was dissolved, which was obtained in Example 1 and 0.021 g of aluminum oxide (AKP-G15, γ-alumina, manufactured by Sumitomo Chemical Co., Ltd.) were mixed while being stirred using a stirrer, thereby obtaining a dispersion liquid in which the polymer and crystalline inorganic fine particles were dispersed.

0.48 g of the solution in which the polymer and the crystalline inorganic fine particles were dispersed and 0.027 g of the dispersion liquid containing the perovskite compound and the solvent, which was obtained in Example 1, were mixed in a glass petri dish (32 φmm) and naturally dried, thereby obtaining a composition containing 5 wt % of the γ-alumina and 500 ppm (g/g) of the perovskite compound.

The obtained composition was cut into a size of 1 cm×1 cm×50 μm, and the quantum yield and the absorption rate thereof were measured using a quantum yield measuring device. As the result, the quantum yield thereof was 16%, and the absorption rate thereof was 0.115.

Comparative Example 4

The dispersion liquid containing the perovskite compound and the solvent which was obtained in Example 1 was mixed with a polysilazane (Durazane 1500 Slow Cure, manufactured by Merck Performance Materials Ltd.), thereby obtaining a dispersion liquid containing the perovskite compound, the solvent, and the polysilazane.

In the dispersion liquid, the molar ratio of Si/Pb was 76.

0.48 g of the solution in which the polymer was dissolved, which was obtained in Example 1 and 0.027 g of the dispersion liquid containing the perovskite compound, the solvent, and the polysilazane were mixed in a glass petri dish (32 φmm) and naturally dried, thereby obtaining a composition containing 500 ppm (μg/g) of the perovskite compound.

The obtained composition was cut into a size of 1 cm×1 cm×50 μm, and the quantum yield and the absorption rate thereof were measured using a quantum yield measuring device. As the result, the quantum yield thereof was 43%, and the absorption rate thereof was 0.145.

Comparative Example 5

The dispersion liquid containing the perovskite compound and the solvent which was obtained in Example 1 was mixed with a polysilazane (Durazane 1500 Slow Cure, manufactured by Merck Performance Materials Ltd.), thereby obtaining 5.1 mL of a dispersion liquid containing the perovskite compound, the solvent, and the polysilazane. In the dispersion liquid, the molar ratio of Si/Pb was 76. The above-described dispersion liquid was subjected to a modification treatment for 1 day while being stirred using a stirrer at 25° C. under a humidity condition of 80%.

0.96 g of the solution in which the polymer was dissolved, which was obtained in Example 1 and 0.032 g of the dispersion liquid which had been subjected to the modification treatment were mixed in a glass petri dish (32 φmm) were mixed and naturally dried, thereby obtaining a composition containing 300 ppm (μg/g) of the perovskite compound.

The obtained composition was cut into a size of 1 cm×1 cm×100 μm, and the quantum yield and the absorption rate thereof were measured using a quantum yield measuring device. As the result, the quantum yield thereof was 67%, and the absorption rate thereof was 0.113.

The configurations of the compositions of Examples 1 to 12 and Comparative Examples 1 to 5, the average particle diameters of the crystalline inorganic fine particles, and the BET specific surface areas are listed in Tables 1 to 3.

TABLE 1

| | Component (2) | | | Composition | |
|---|---|---|---|---|---|
| | Type | Average particle diameter (μm) | Specific surface area (m²/g) | Component (6) Type | Quantum yield (%) | Absorption rate |
| Example 1 | α-Alumina AA-02 | 0.2 | 7.5 | — | 34 | 0.243 |
| Example 2 | α-Alumina AA-3 | 3.4 | 0.5 | — | 37 | 0.193 |
| Example 3 | α-Alumina AA-18 | 20.3 | 0.1 | — | 32 | 0.168 |
| Comparative Example 1 | — | — | — | — | 26 | 0.146 |
| Comparative Example 2 | γ-Alumina KC-501 | 1.5 | 200 | — | 22 | 0.129 |
| Comparative Example 3 | γ-Alumina AKP-G15 | 0.015 | 164 | — | 16 | 0.115 |

TABLE 2

| | Component (2) | | | Composition | |
|---|---|---|---|---|---|
| | Type | Average particle diameter (μm) | Specific surface area (m²/g) | Component (6) Type | Quantum yield (%) | Absorption rate |
| Example 4 | α-Alumina AA-02 | 0.2 | 7.5 | Polysilazane | 59 | 0.287 |
| Example 5 | α-Alumina AA-3 | 3.4 | 0.5 | Polysilazane | 58 | 0.256 |
| Example 6 | α-Alumina AA-18 | 20.3 | 0.1 | Polysilazane | 55 | 0.22 |
| Example 7 | Zinc oxide | 1 | 4.7 | Polysilazane | 49 | 0.279 |
| Example 8 | Niobium oxide | 1 | 6.3 | Polysilazane | 67 | 0.378 |
| Comparative Example 4 | — | — | — | Polysilazane | 43 | 0.145 |

TABLE 3

| | Component (2) | | | Composition | |
|---|---|---|---|---|---|
| | Type | Average particle diameter (μm) | Specific surface area (m²/g) | Component (6) Type | Quantum yield (%) | Absorption rate |
| Example 9 | α-Alumina AKP-53 | 0.18 | 11.7 | Polysilazane (modified product) | 78 | 0.149 |
| Example 10 | α-Alumina AKP-3000 | 0.7 | 4.5 | Polysilazane (modified product) | 71 | 0.265 |
| Example 11 | α-Alumina AKP-30 | 0.27 | 6.7 | Polysilazane (modified product) | 71 | 0.206 |
| Example 12 | α-Alumina AKP-50 | 0.2 | 10.3 | Polysilazane (modified product) | 72 | 0.222 |
| Comparative Example 5 | — | — | — | Polysilazane (modified product) | 67 | 0.113 |

As shown in the results described above, it was found that each composition of Examples 1 to 12 of the present invention had an improved quantum yield. On the contrary, improvement of the quantum yield was not found in Comparative Examples 1 to 5.

Reference Example 1

A backlight that is capable of converting blue light of a blue light-emitting diode to green light or red light by putting each composition of Examples 1 to 12 into a glass tube or the like so as to be sealed after the solvent is removed as necessary and disposing the glass tube or the like between a light-guiding plate and the blue light-emitting diode serving as a light source is produced.

Reference Example 2

A backlight that is capable of converting blue light to be applied to a sheet after passing through a light-guiding plate from a blue light-emitting diode placed on an end surface (side surface) of the light-guiding plate to green light or red light by forming the sheet using each composition of Examples 1 to 12 to obtain a resin composition after the solvent is removed as necessary and placing a film obtained by interposing the sheet between two barrier films so as to be sealed on the light-guiding plate is produced.

Reference Example 3

A backlight that is capable of converting blue light to be applied to green light or red light by placing each composition of Examples 1 to 12 in the vicinity of a light-emitting unit of a blue light-emitting diode after the solvent is removed as necessary is produced.

Reference Example 4

A wavelength conversion material can be obtained by mixing each composition of Examples 1 to 12 with a resist and removing the solvent as necessary. A backlight that is capable of converting blue light from a light source to green light or red light by disposing the obtained wavelength conversion material between the blue light-emitting diode serving as a light source and a light-guiding plate and on a back stage of an OLED serving as a light source is produced.

Reference Example 5

An LED is obtained by mixing each composition of Examples 1 to 12 with conductive particles such as ZnS to form a film, laminating an n-type transport layer on one surface of the film, and laminating a p-type transport layer on the other surface thereof. The LED is allowed to emit light by circulating the current so that positive holes of the p-type semiconductor and electrons of the n-type semiconductor cancelled the charge in the perovskite compound of the bonding surface.

Reference Example 6

A solar cell is prepared by laminating a titanium oxide dense layer on a surface of a fluorine-doped tin oxide (FTO) substrate, laminating a porous aluminum oxide layer thereon, laminating each composition of Examples 1 to 12 thereon, laminating a hole transport layer such as 2,2',7,7'-tetrakis-(N,N'-di-p-methoxyphenylamine)-9,9'-spirobifluorene (Spiro-OMeTAD) thereon after the solvent is removed, and laminating a silver (Ag) layer thereon.

Reference Example 7

A laser diode illumination emitting white light by converting blue light applied from a blue light-emitting diode to a resin molded body to green light or red light is produced by mixing each composition of Examples 1 to 12 with a resin, removing the solvent for molding to obtain the resin composition containing the composition according to the present invention, and placing the resin composition on a back stage of the blue light-emitting diode.

INDUSTRIAL APPLICABILITY

According to the present invention, it is possible to provide a composition which contains a perovskite compound and has a high quantum yield. Further, it is also possible to provide a film, a laminated structure, and a display obtained by using the composition.

REFERENCE SIGNS LIST

1a: first laminated structure
1b: second laminated structure
10: film
20: first substrate
21: second substrate
22: sealing layer
2: light-emitting device
3: display
30: light source
40: liquid crystal panel
50: prism sheet
60: light-guiding plate

What is claimed is:

1. A composition having a light-emitting property comprising:
a perovskite compound including
a metal ion,
a monovalent cation positioned at each vertex of a hexahedron having the metal ion at the center in a perovskite type crystal structure,
at least one anion selected from the group consisting of a halide ion and a thiocyanate ion, the anion being positioned at each vertex of an octahedron having the metal ion at the center in the perovskite type crystal structure; and
inorganic fine particles having a specific surface area of 0.01 $m^2/g$ to 150 $m^2/g$, and
wherein an average particle diameter of the inorganic fine particles is in a range of 3.4 μm to 100 μm.

2. A composition having a light-emitting property comprising:
a perovskite compound including
a metal ion,
a monovalent cation positioned at each vertex of a hexahedron having the metal ion at the center in a perovskite type crystal structure,
at least one anion selected from the group consisting of a halide ion and a thiocyanate ion, the anion being positioned at each vertex of an octahedron having the metal ion at the center in the perovskite type crystal structure; and
inorganic fine particles having a specific surface area of 0.01 $m^2/g$ to 150 $m^2/g$,
wherein the inorganic fine particles comprise at least one selected from the group consisting of aluminum oxide, zinc oxide, and niobium oxide, and
wherein an average particle diameter of aluminum oxide is in a range of 3.4 μm to 100 μm.

3. The composition according to claim 2, wherein the specific surface area is in a range of 0.1 $m^2/g$ to 70 $m^2/g$.

4. The composition according to claim 3, wherein the specific surface area is in a range of 0.4 $m^2/g$ to 10 $m^2/g$.

5. The composition according to claim 2, wherein an average particle diameter of zinc oxide or niobium oxide is in a range of 100 nm to 100 μm.

6. The composition according to claim 5, wherein the average particle diameter of zinc oxide or niobium oxide is in a range of 150 nm to 30 μm.

7. The composition according to claim 6, wherein the average particle diameter of zinc oxide or niobium oxide is in a range of 170 nm to 5 μm.

8. The composition according to claim 2, wherein the inorganic fine particles comprise at least one selected from the group consisting of aluminum oxide and niobium oxide.

9. The composition according to claim 2, wherein the inorganic fine particles comprise niobium oxide.

10. The composition according to claim 2, wherein the perovskite compound has a three-dimensional structure.

11. The composition according to claim 2, wherein the monovalent cation is a cesium ion.

12. The composition according to claim 2, further comprising at least one selected from the group consisting of a solvent and a polymerizable compound or a polymer thereof.

13. The composition according to claim 2, further comprising a polymer, wherein a total content ratio of the perovskite compound, the inorganic fine particles, and the polymer is 90% by mass or greater with respect to a total mass of the composition.

14. The composition according to claim 2, further comprising at least one selected from the group consisting of ammonia, an amine, a carboxylic acid, and salts or ions thereof.

15. The composition according to claim 2, further comprising a silazane or a modified product thereof.

16. The composition according to claim 15, wherein the silazane or a modified product thereof comprises a polysilazane or a modified product thereof.

17. A film which is formed of the composition according to claim 13.

18. A laminated structure comprising the film according to claim 17.

19. A light-emitting device comprising the laminated structure according to claim 18.

20. A display comprising the laminated structure according to claim 18.

* * * * *